(12) United States Patent
Booman et al.

(10) Patent No.: US 8,963,568 B2
(45) Date of Patent: Feb. 24, 2015

(54) RESISTIVE PROBING TIP SYSTEM FOR LOGIC ANALYZER PROBING SYSTEM

(75) Inventors: Richard A. Booman, Lake Oswego, OR (US); Neil C. Clayton, Hillsboro, OR (US); Bruce C. Tollbom, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 733 days.

(21) Appl. No.: 13/075,425

(22) Filed: Mar. 30, 2011

(65) Prior Publication Data
US 2011/0241714 A1 Oct. 6, 2011

Related U.S. Application Data

(60) Provisional application No. 61/319,678, filed on Mar. 31, 2010, provisional application No. 61/319,674, filed on Mar. 31, 2010.

(51) Int. Cl.
| | |
|---|---|
| *G01R 31/02* | (2006.01) |
| *G01R 1/067* | (2006.01) |
| *G01R 1/073* | (2006.01) |
| *H01R 12/71* | (2011.01) |
| *H01R 13/66* | (2006.01) |

(52) U.S. Cl.
CPC ........ *G01R 1/06772* (2013.01); *G01R 1/07314* (2013.01); *H01R 12/714* (2013.01); *H01R 13/6658* (2013.01); *H01R 13/6616* (2013.01)
USPC ............ 324/755.01; 324/755.11; 324/756.02; 324/757.01; 439/638

(58) Field of Classification Search
CPC ........... G01R 31/2889; G01R 1/07342; G01R 31/2893
USPC ................ 324/750.01–757.02; 439/638–657, 439/620.04–620.24
See application file for complete search history.

(56) References Cited

U.S. PATENT DOCUMENTS

| | | | | |
|---|---|---|---|---|
| 4,771,236 | A * | 9/1988 | Banks | 324/756.02 |
| 4,853,626 | A * | 8/1989 | Resler | 324/755.01 |
| 6,030,254 | A * | 2/2000 | Johnson et al. | 439/496 |

(Continued)

OTHER PUBLICATIONS

Spirit Compression Test Probe, p. 4, Samtec Test Solutions Design Guide, Feb. 2009, pp. 16.

(Continued)

*Primary Examiner* — Vincent Q Nguyen
*Assistant Examiner* — Emily Chan
(74) *Attorney, Agent, or Firm* — Andrew J. Harrington; William K. Bucher; Marger Johnson & McCollom, PC

(57) ABSTRACT

The resistive probing tip system has one or more carriers and one or more electrical contact assemblies. Each carrier has opposing surfaces with a plurality of resistors engaging the carrier. Each of the plurality of resistors has opposing electrical contacts that are exposed at respective opposing surfaces of the carrier. Each electrical contact assembly has opposing surfaces with electrical contacts exposed at the opposing surfaces with each electrical contact exposed on one surface coupled to a corresponding electrical contact on the other opposing surface. The carrier(s) and the electrical contact assembly(s) selectively mate to and mate from one another with the electrical contacts exposed at the opposing surfaces the carrier(s) and the electrical contact assembly(s) contacting one another. The carrier(s) and/or the electrical contact assembly(s) may be selectively secured to either of a circuit board or a probe head.

20 Claims, 32 Drawing Sheets

(56) References Cited

U.S. PATENT DOCUMENTS

| | | | |
|---|---|---|---|
| 6,636,058 B2* | 10/2003 | Lyford | 324/756.04 |
| 6,781,391 B2 | 8/2004 | Reed | |
| 6,888,361 B1 | 5/2005 | Engquist | |
| 2001/0043075 A1* | 11/2001 | Suzuki | 324/763 |
| 2002/0151193 A1* | 10/2002 | Self et al. | 439/65 |
| 2005/0134298 A1 | 6/2005 | Campbell et al. | |
| 2005/0266733 A1 | 12/2005 | Martin et al. | |
| 2006/0033513 A1* | 2/2006 | LaMeres et al. | 324/754 |
| 2009/0161331 A1 | 6/2009 | Sato et al. | |

OTHER PUBLICATIONS

European Patent Office, Extended European Search Report, Jul. 21, 2014, 6 pages, EPO, Munich, Germany.

* cited by examiner

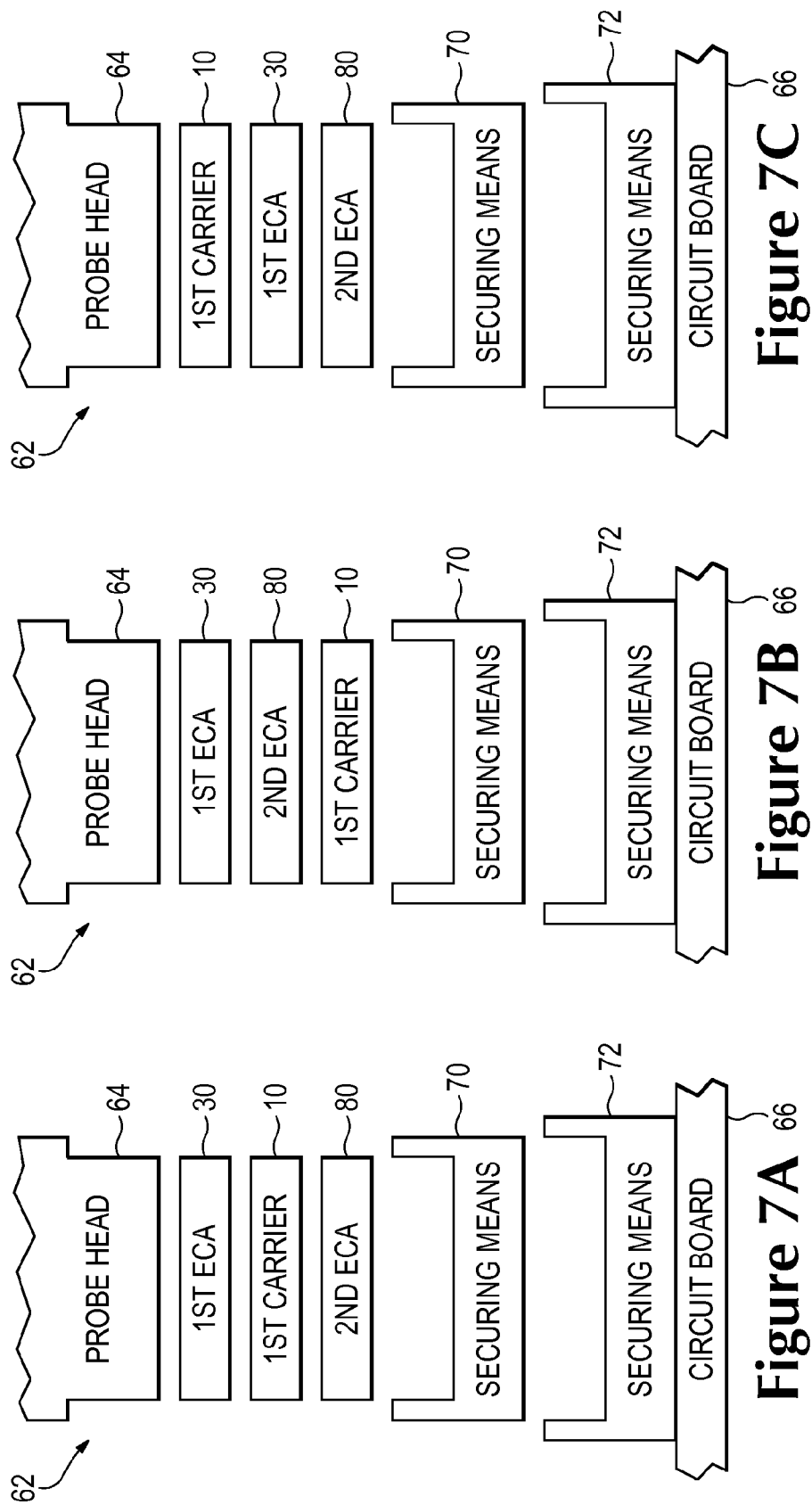

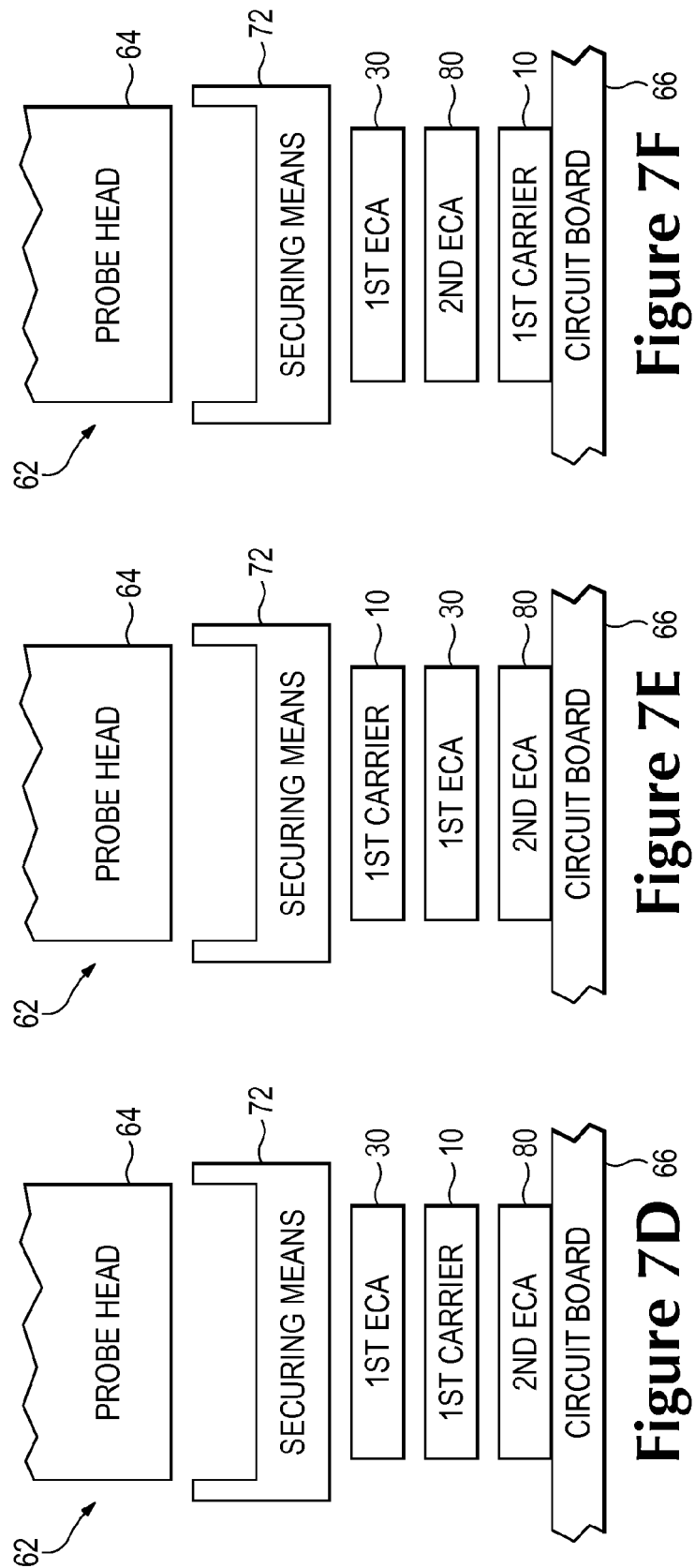

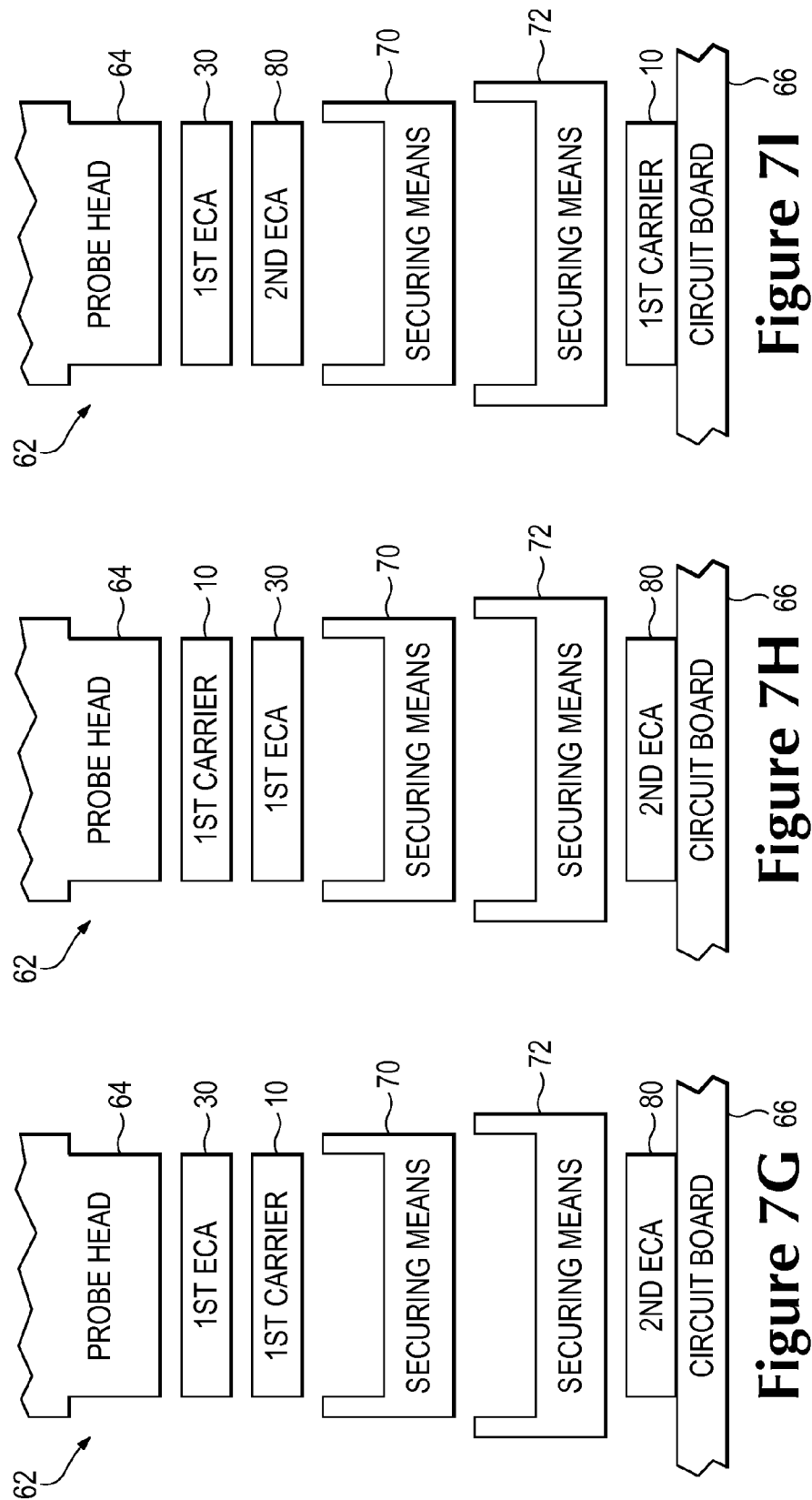

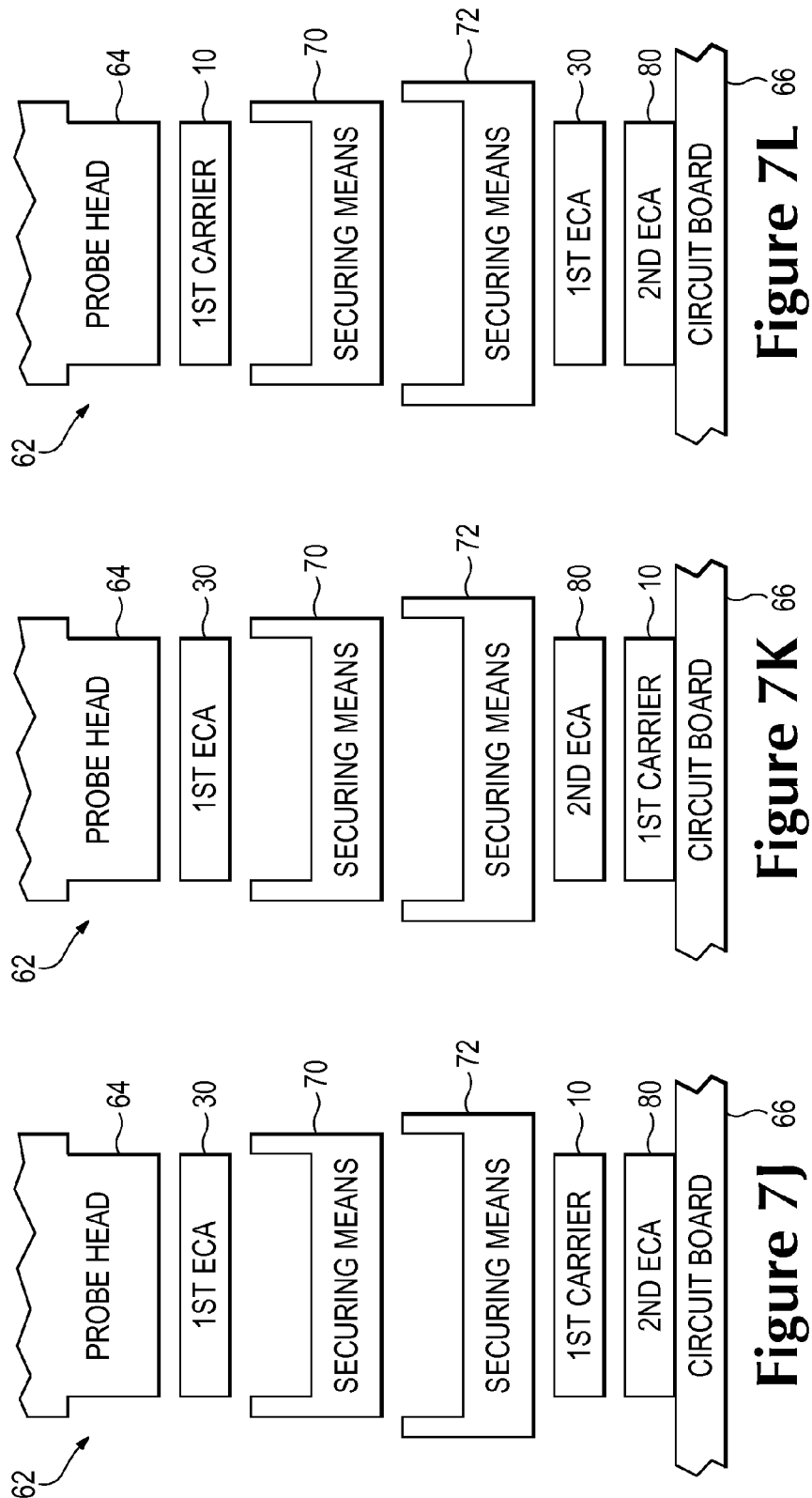

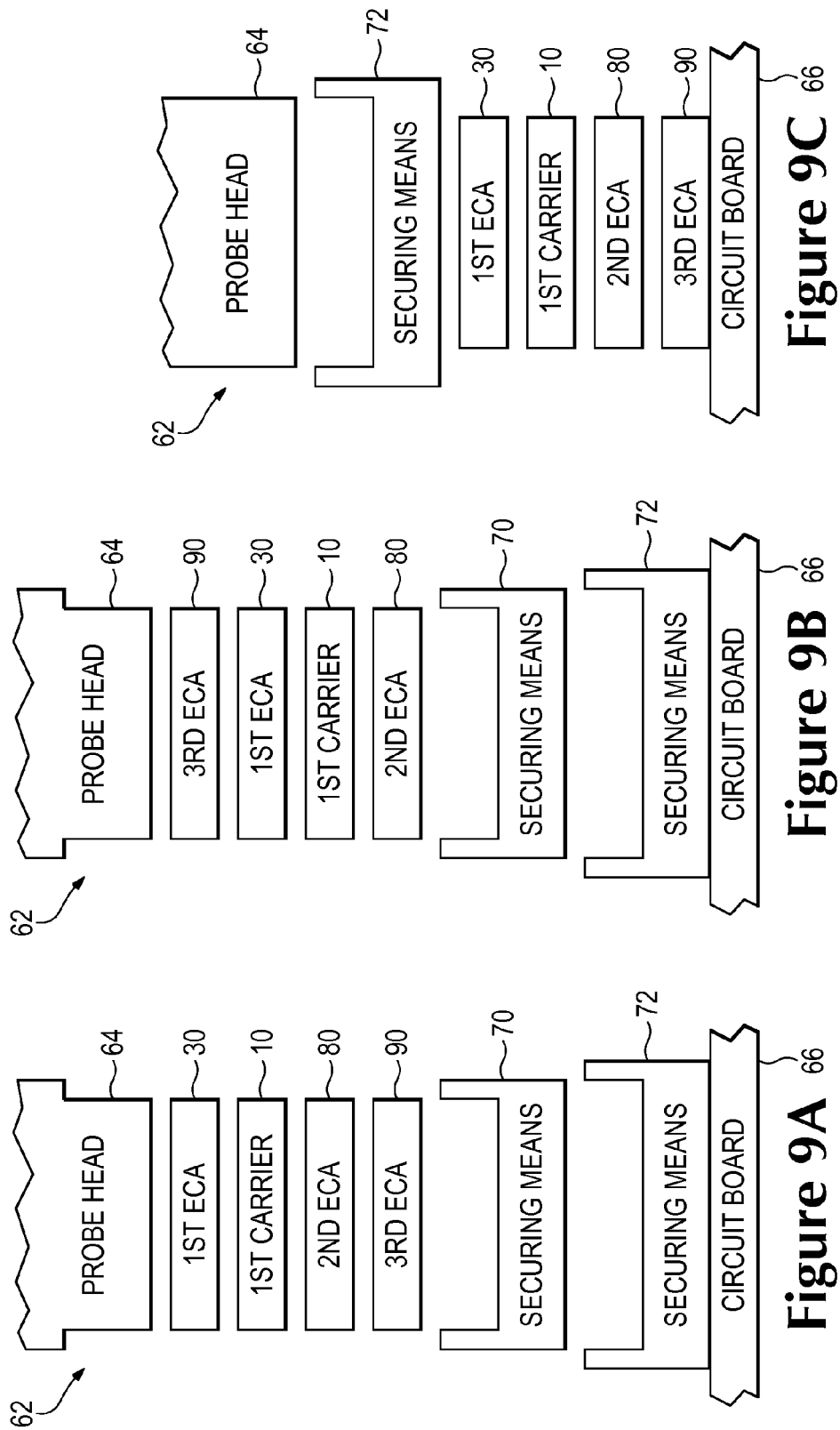

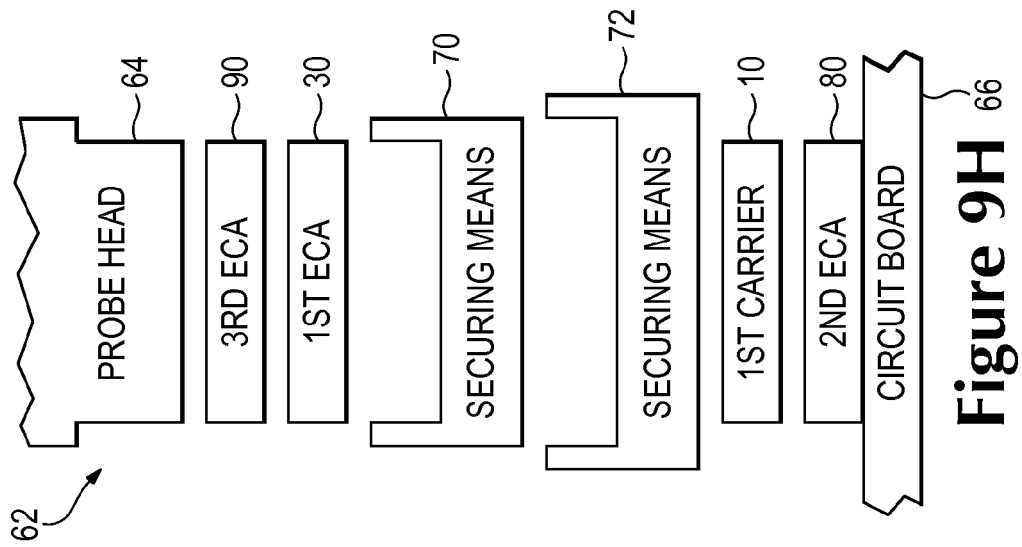
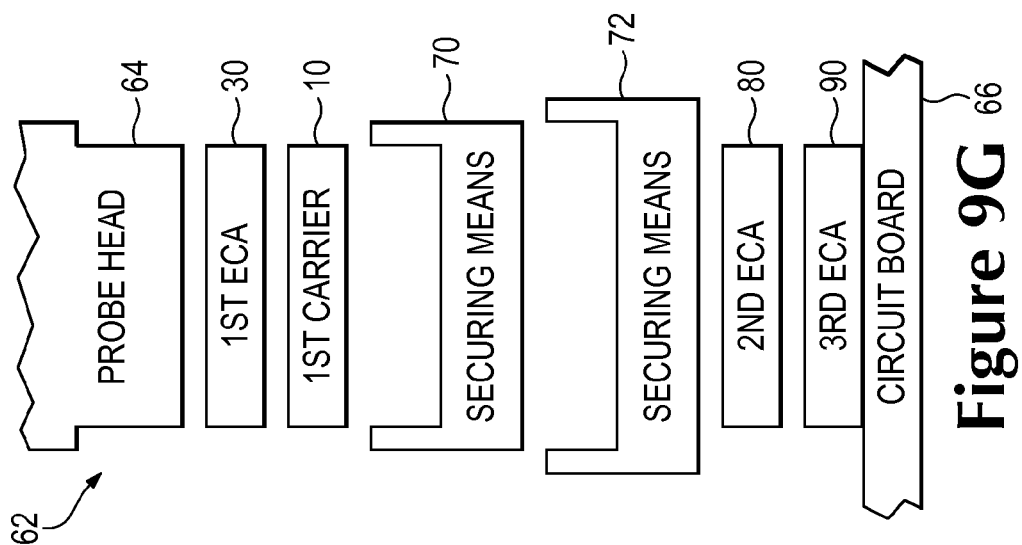

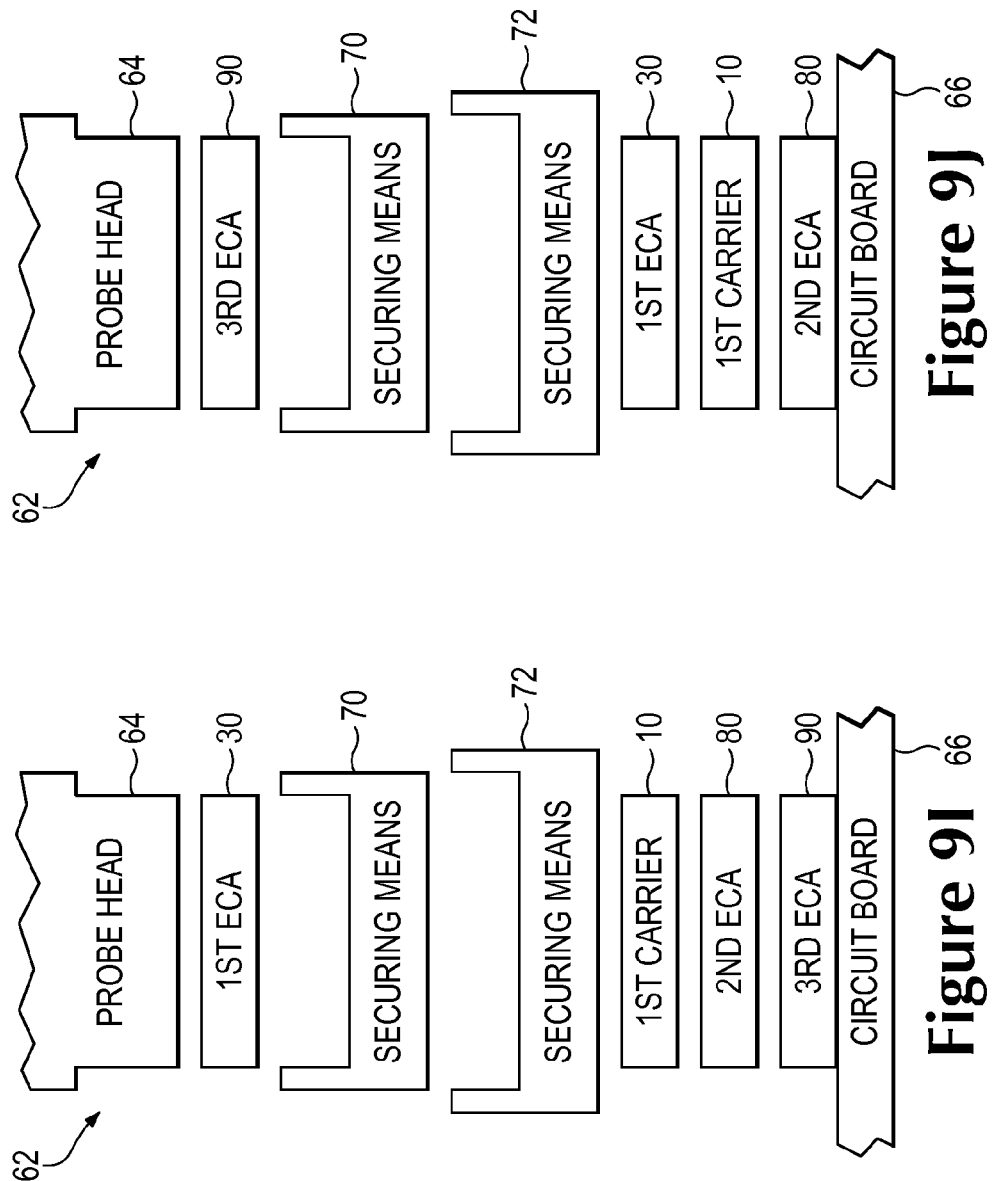

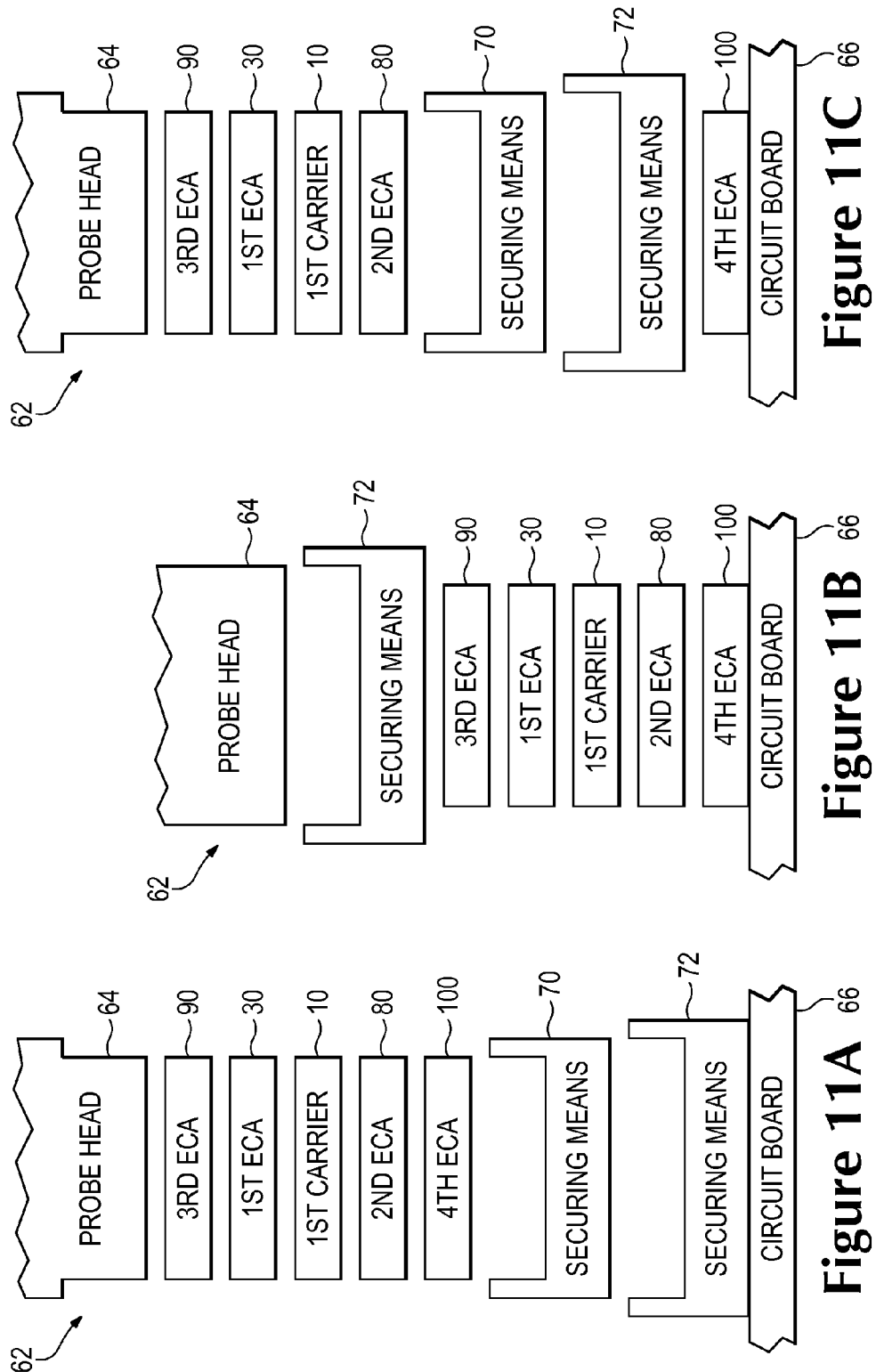

RESISTIVE PROBING TIP SYSTEM FOR LOGIC ANALYZER PROBING SYSTEM

CROSS-REFERENCE TO RELATED APPLICATIONS

This application claims priority to U.S. Provisional Application Ser. No. 61/319,674 filed Mar. 31, 2010, and entitled "HYBRID RESISTOR ARRAY FOR A LOGIC ANALYZER PROBE," and to U.S. Provisional Application Ser. No. 61/319,678 filed Mar. 31, 2010, and entitled "DISCRETE RESISTOR ARRAY FOR PROBING."

FIELD OF THE INVENTION

The present invention relates to resistive probing tip systems, and more particularly to resistive probing tip systems incorporated into logic analyzer probing systems for high-speed probing of a device under test.

BACKGROUND OF THE INVENTION

One of the problems with making a high speed logic analyzer probe is that the probe will perturb the system under test. These types of probes generally have input impedances of a few hundred ohms, but there is usually a short compliant contact between the electrical contact on the circuit board of the device under test (DUT) and the input resistance, which is described in U.S. Pat. Nos. 6,888,361 and 6,781,391, which are incorporated herein by reference. In multi-conductor probing applications involving logic analyzer probes or Mixed Signal Oscilloscope probes, an interconnect is employed to achieve individual compliance of each contact being tested, resulting in a stub.

A prime example is a probe head with pogo pins. These provide adequate compliance, but become an unterminated stub on the circuit being tested. This unterminated stub will reflect energy back into the system under test, so a long time delay in the compliant contact is undesirable. Electrical stubs can impact the circuit being probed, so probe designers seek to minimize the stubs. The ideal probe tip would have a resistive element at the point of contact, thereby creating no stub.

However, existing probing methods place input resistors approximately 0.100 inches from the DUT contact points of the circuit to be probed, creating a 'stub' on the probed circuit. Two elements contribute to the 'stub length': (1) the compliant interconnect socket, and (2) limitations of placing resistors close to the edge of the circuit board of the probe head. The length of the time delay in the compliant contact is one of the factors that limit the speed at which the probe can be used.

An example of a compliant interconnect socket is a Spirit® Compression Test Probe, manufactured and sold by Samtec, Inc., New Albany, Ind. The Spirit® Compression Test Probe has mounting brackets positioned on either side of parallel rows of contact points on a circuit board of the DUT. Parallel rows of passive resistors corresponding to the parallel rows of contact points on the circuit board are embedded in a connector housing that is positioned between the mounting brackets. Each passive resistor is secured to a lower spring contact and an upper spring contact with the lower spring contact engaging one of the contact points on the circuit board and the upper spring contact engaging a corresponding contact point in a probe head. The stub length of the lower spring contact is 0.100 inches.

In previous implementations of logic analyzer probes, the resistor has resided on a circuit board in the probe head, and the compliant contact comes into contact with the edge of the circuit board. The length of the contact and the amount the resistor is set back from the edge of the circuit board both contribute to the unterminated stub length. The distance that the resistor is set back from the edge of the circuit board is determined by circuit board manufacturing constraints. In addition, the edge wrap on the circuit board produces an edge that is somewhat rough and departs from planarity because of the process of routing and plating the laminated circuit board edge. Therefore, there is a need for a resistive probing tip system that enables probing at higher speeds by decreasing the stub length on the probed circuit.

SUMMARY OF THE INVENTION

The present invention provides a resistive probing tip system usable in a logic analyzer probing system that overcomes the above-mentioned disadvantages and drawbacks of the prior art. The resistive probing tip system has at least a first carrier and a first electrical contact assembly. The first carrier has opposing surfaces with a plurality of resistors engaging the first carrier. Each of the plurality of resistors has opposing electrical contacts that are exposed at respective surfaces of the first carrier. The plurality of resistors may be discrete resistors disposed in apertures formed through the first carrier. The first carrier may also be a ceramic substrate with the plurality of resistors disposed upon one or both of the opposing surfaces of the substrate. The first electrical contact assembly has opposing surfaces with electrical contacts exposed at the respective opposing surfaces. Each electrical contact exposed at one opposing surface is electrically coupled to a corresponding electrical contact exposed at the other opposing surface. The first electrical contact assembly may be formed using flex circuit material or formed using an elastomeric material having electrically conductive elastomeric contact. The first electrical contact assembly may also be formed using a housing having compressible spring contacts disposed therein. The first carrier and the first electrical contact assembly selectively mate to and mate from each other with the electrical contacts exposed at one surface of the first carrier and the electrical contacts exposed at one surface of the first electrical contact assembly contacting each other. The first carrier and/or the first electrical contact assembly may be selectively secured to either of a circuit board of a device under test or a probe head.

The resistive probing tip system may also have multiple carriers having opposing surfaces. The multiple carriers have the same or similar construction as the first carrier. The first carrier and one or more of the multiple carriers selectively mate to and mate from the first electrical contact assembly. The electrical contacts exposed at one surface of the respective first carrier and one or more of the multiple carriers contact corresponding electrical contacts exposed at one surface of the first electrical contact assembly. The first carrier and one or more of the multiple carriers and/or the first electrical contact assembly may be selectively secured to either of a circuit board of a device under test or a probe head.

The resistive probing tip system may also have multiple electrical contact assemblies having opposing surfaces. The multiple electrical contact assemblies have the same or similar construction as the first electrical contact assembly. The electrical contacts exposed at the opposing surfaces of the first electrical contact assembly, one or more of the multiple electrical contact assemblies, the first carrier and one or more of the multiple carriers selectively contact corresponding electrical contacts exposed at the mating opposing surfaces of the first electrical contact assembly, one or more of the multiple electrical contact assemblies, the first carrier and one or more of the multiple carriers. The first carrier or the first carrier and one or more of the multiple carriers and/or the first electrical contact assembly and/or the first electrical contact assembly and one or more of the multiple electrical contact assemblies may be selectively secured to either of a circuit board of a device under test or a probe head.

The resistive probing tip system may be configured with the first carrier or the first and one or more of the multiple carriers disposed between the first electrical contact assembly and a second electrical contact assembly of the multiple electrical contact assemblies. A third electrical contact assembly of the multiple electrical contact assemblies may be included that selectively mates to and mates from at least one of the first electrical contact assembly and the second electrical contact assembly. A fourth electrical contact assembly of the multiple electrical contact assemblies may be included that selectively mates to and mates from the other of the first electrical contact assembly and the second electrical contact assembly.

A logic analyzer probing system has a probe head containing at least a first circuit board having electrical contacts thereon and a resistive probing tip system having at least a first carrier and a first electrical contact assembly. The first carrier has opposing surfaces with a plurality of resistors engaging the first carrier. Each of the plurality of resistors has opposing electrical contacts that are exposed at respective surfaces of the first carrier. The plurality of resistors may be discrete resistors disposed in apertures formed through the first carrier. The first carrier may also be a ceramic substrate with the plurality of resistors disposed upon one or both of the opposing surfaces of the substrate. The first electrical contact assembly has opposing surfaces with electrical contacts exposed at the respective opposing surfaces. Each electrical contact exposed at one opposing surface is electrically coupled to a corresponding electrical contact exposed at the other opposing surface. The first electrical contact assembly may be formed using flex circuit material or formed using an elastomeric material having electrically conductive elastomeric contact. The first electrical contact assembly may also be formed using a housing having compressible spring contacts disposed therein. The first circuit board, the first electrical contact assembly and the first carrier selectively mate to and mate from one another with the electrical contacts exposed at the surfaces of the first circuit board, the first electrical contact assembly and the first carrier contacting corresponding electrical contacts exposed at the mating surfaces of the first circuit board of the probe head, the first electrical contact assembly and the first carrier. A housing secures at least one of the first electrical contact assembly and the first carrier between the first circuit board of the probe head and the housing.

The logic analyzer probing system may also have at least a second electrical contact assembly having opposing surfaces. The second electrical contact assembly has the same or similar construction as the first electrical contact assembly. The first electrical contact assembly, second electrical contact assembly and the first carrier selectively mate to and mate from one another with the electrical contacts exposed at the opposing surfaces of the first electrical contact assembly, the second electrical contact assembly and the first carrier contacting corresponding electrical contacts exposed at the mating surfaces of the first electrical contact assembly, the second electrical contact assembly and the first carrier. The housing receives the second electrical contact assembly or the first carrier for capturing the first carrier, the first electrical contact assembly and the second electrical contact assembly or the first electrical contact assembly and the second electrical contact assembly between the first circuit board of the probe head and the housing.

The second electrical contact assembly may also be secured to a circuit board of a device under test having a plurality of electrical contacts. The electrical contacts exposed at one surface of the second electrical contact assembly selectively mates to and mates from the electrical contacts of the circuit board of the device under test and the electrical contacts exposed at the other surface of the second electrical contact assembly selectively mate to and mate from the electrical contacts of the first carrier or the first electrical contact assembly.

The probe head of the logic analyzer probing system may also have a second circuit board having electrical contacts thereon and a second carrier. The second carrier has the same or similar construction as the first carrier. The second circuit board of the probe head, the first electrical contact assembly and the second carrier selectively mate to and mate from one another with the electrical contacts exposed the surfaces of the second circuit board of the probe head, the first electrical contact assembly and the second carrier contacting corresponding electrical contacts exposed at the mating surfaces of the second circuit board of the probe head, the first electrical contact assembly and the second carrier. The housing receives the first electrical contact assembly or the first and second carriers for capturing the first electrical contact assembly and the first and second carriers or the first electrical contact assembly or the first and second carriers between the first and second circuit boards of the probe head and the housing.

A second electrical contact assembly may also be used with a second circuit board in the probe head having electrical contacts thereon and a second electrical contact assembly. The second electrical contact assembly has the same or similar construction as the first electrical contact assembly. The second electrical contact assembly selectively mates to and mates from the first and second carriers or the first electrical contact assembly with the electrical contacts exposed at the surfaces of the second electrical contact assembly contacting corresponding electrical contacts exposed at the mating surfaces of the first and second carriers or the first electrical contact assembly. The housing receives the second electrical contact assembly or the first and second carriers for capturing the first and second carriers, the first electrical contact assembly and the second electrical contact assembly or the first electrical contact assembly and the second electrical contact assembly between the first and second circuit boards of the probe head and the housing.

The second electrical contact assembly may also be secured to a circuit board of a device under test having a plurality of electrical contacts. The electrical contacts exposed at one surface of the second electrical contact assembly selectively mates to and mates from the electrical contacts of the circuit board of the device under test and the electrical contacts exposed at the other surface of the second electrical contact assembly selectively mate to and mate from the electrical contacts of the first and second carriers or the first electrical contact assembly.

The objects, advantages and other novel features of the present invention are apparent from the following detailed description when read in conjunction with the appended claims and attached drawings.

BRIEF DESCRIPTION OF THE DRAWINGS

FIGS. 7A through 7L are various configurations using first and second electrical contact assemblies and a carrier in the resistive probing tip system according to the present invention.

FIGS. 9A through 9J are various configurations using first, second and third electrical contact assemblies and a carrier in the resistive probing tip system according to the present invention.

FIGS. 11A through 11F are various configurations using first, second, third and fourth electrical contact assemblies and a carrier in the resistive probing tip system according to the present invention.

DESCRIPTION OF THE INVENTION

Figure 1:
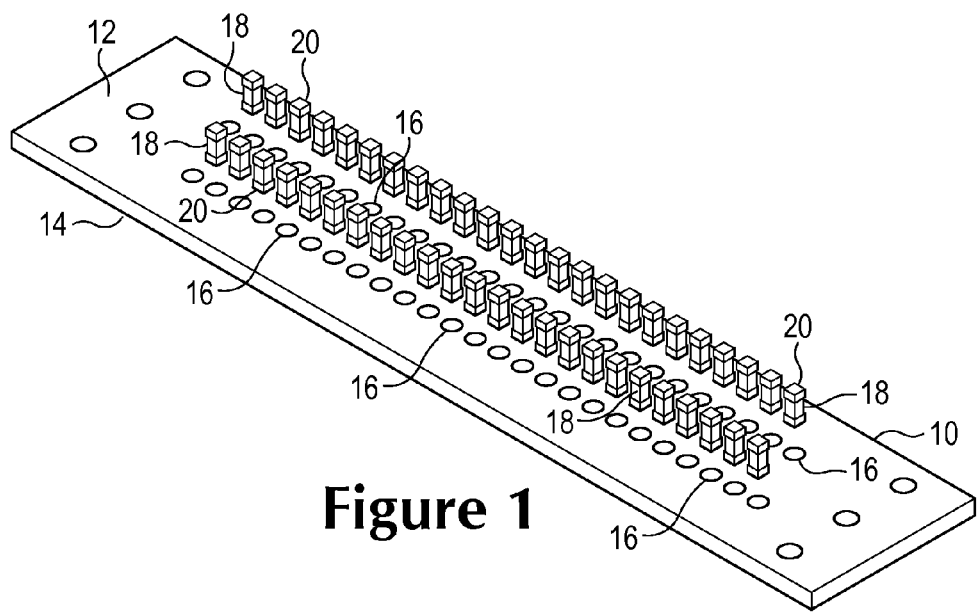
FIG. 1 is an exploded perspective view of a first embodiment of a carrier receiving discrete resistive elements usable in a resistive probing tip system according to the present invention.

Referring to FIG. 1, there is shown an exploded perspective view of a carrier 10 usable in a resistive probing tip system according to the present invention. The carrier 10 may be formed as a planar body having opposing surfaces 12 and 14 using a non-conductive material, such as plastic, elastomer, and the like. Apertures 16 are formed through the carrier 10 that extend to the opposing surfaces 12, 14. Discrete resistive elements 18 having electrical contacts 20 at opposing ends thereof are disposed in the apertures 16 with the electrical contacts 20 of the discrete resistive elements 18 exposed at the opposing surfaces 12, 14 of the carrier 10. Discrete resistive elements 18 that are suitable for use in carrier 10 include the CRCW0402 and CRCW0201 Thick Film, Rectangular Chip Resistors, manufactured and sold by Vishay Intertechnolgy, Inc., Malvern, Pa. A carrier 10 formed of elastomer preferably should have a durometer of approximately 70 (Shore A) in the current embodiment in order to both retain the resistive elements 18 and permit individual compliance of each resistive element 18. However, a durometer ranging from approximately 50 to approximately 100 would also be suitable.

Figure 2A:
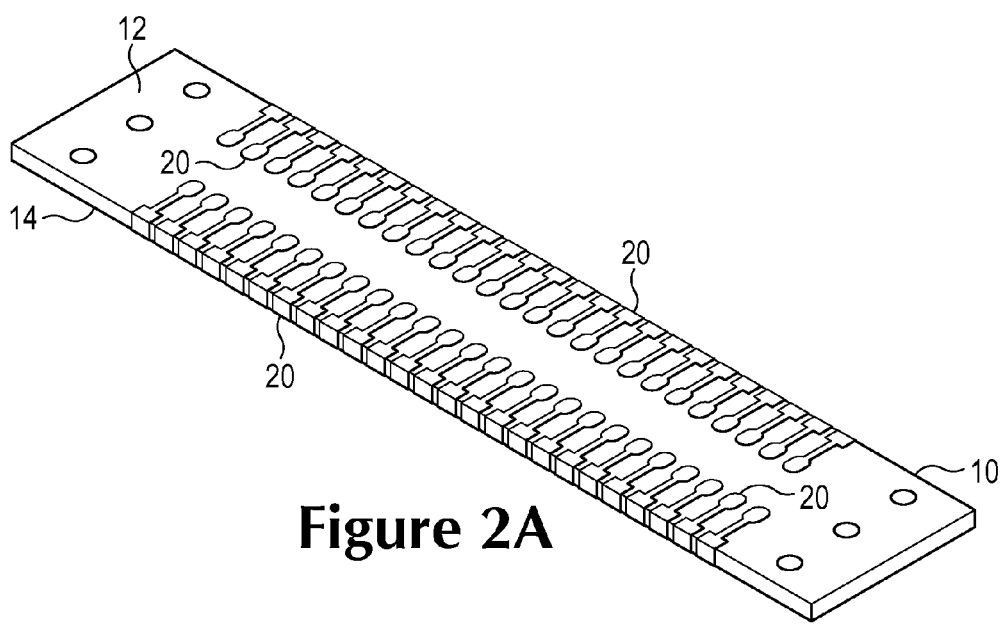
FIGS. 2A and 2B are perspective views of a second embodiment of a carrier having resistive elements and electrical contacts formed thereon usable in a resistive probing tip system according to the present invention.
Figure 2B:
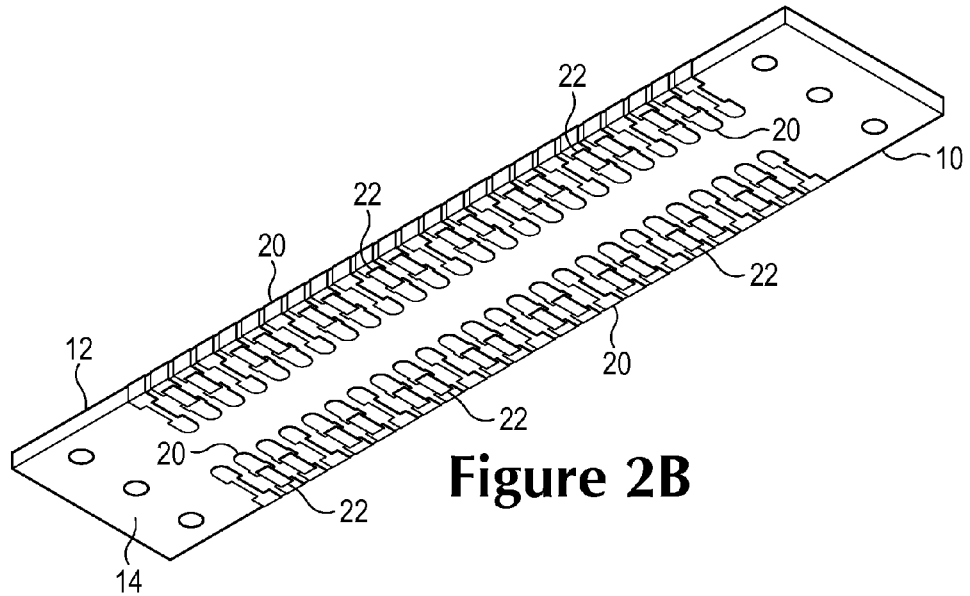

FIGS. 2A and 2B shows perspective top and bottom views of another carrier 10 that may be formed as a substrate using a ceramic material or the like. The ceramic substrate carrier 10 has opposing surfaces 12, 14 with electrical contacts 20 formed on the opposing surfaces 12, 14. Resistive elements 22 are formed on the ceramic substrate carrier 10 with each end of the resistive elements 22 being coupled to an electrical contact 20. The resistive elements 22 and electrical contacts 20 are formed using well-known thick film, thin film, or other technologies. One of the electrical contacts 20 of each resistive element 22 is formed on one of the opposing surfaces 12, 14 of the ceramic substrate carrier 10 and the other electrical contact 20 of each resistive element 22 is formed on the other of the opposing surface 12, 14 of the ceramic substrate carrier 10. Alternately, the electrical contacts 20 may be formed on the opposing side surfaces of the ceramic substrate carrier 10 with this alternative being equivalent to the electrical contacts 20 being formed on the opposing flat surfaces 12, 14 of the ceramic substrate carrier 10. A further alternative has the resistive elements 22 formed of discrete resistors with one end of each discrete resistor connected to an electrical contact 20 formed on one of the opposing side surfaces of the ceramic substrate carrier 10 and the other end of each discrete resistor connected to an electrical contact 20 formed on the other of the side surfaces of the ceramic substrate carrier 10.

Figure 3A:
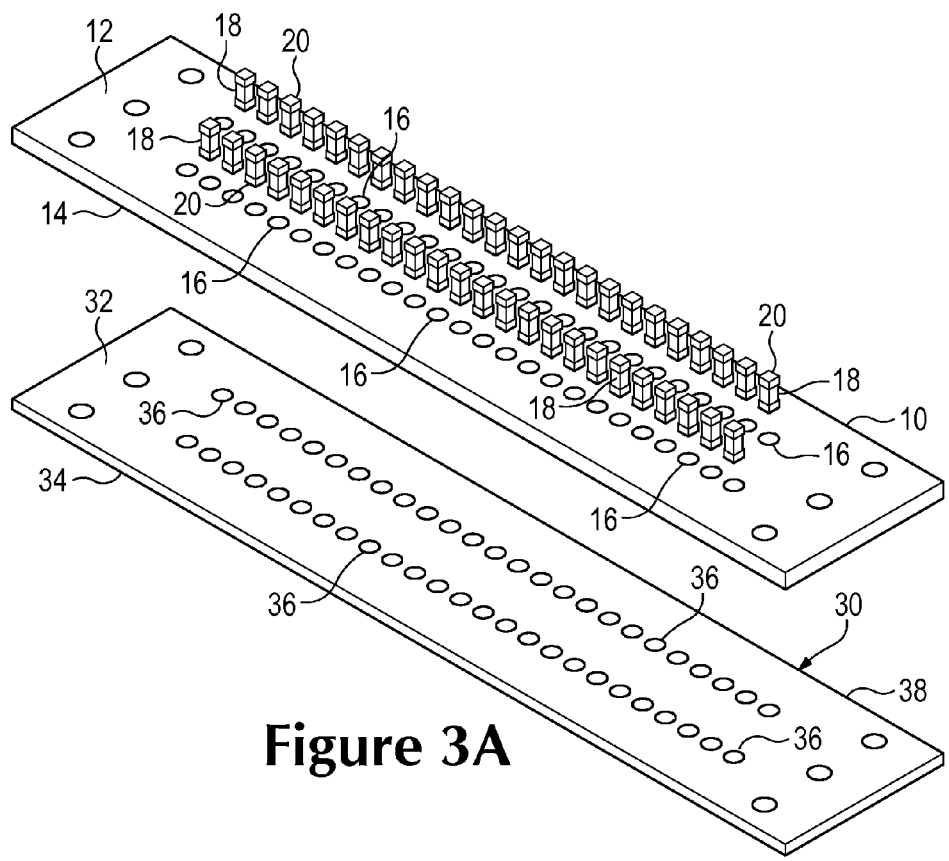
FIG. 3A is an exploded perspective view of a first embodiment of an electrical contact assembly usable in a resistive probing tip system according to the present invention.
Figure 3B:
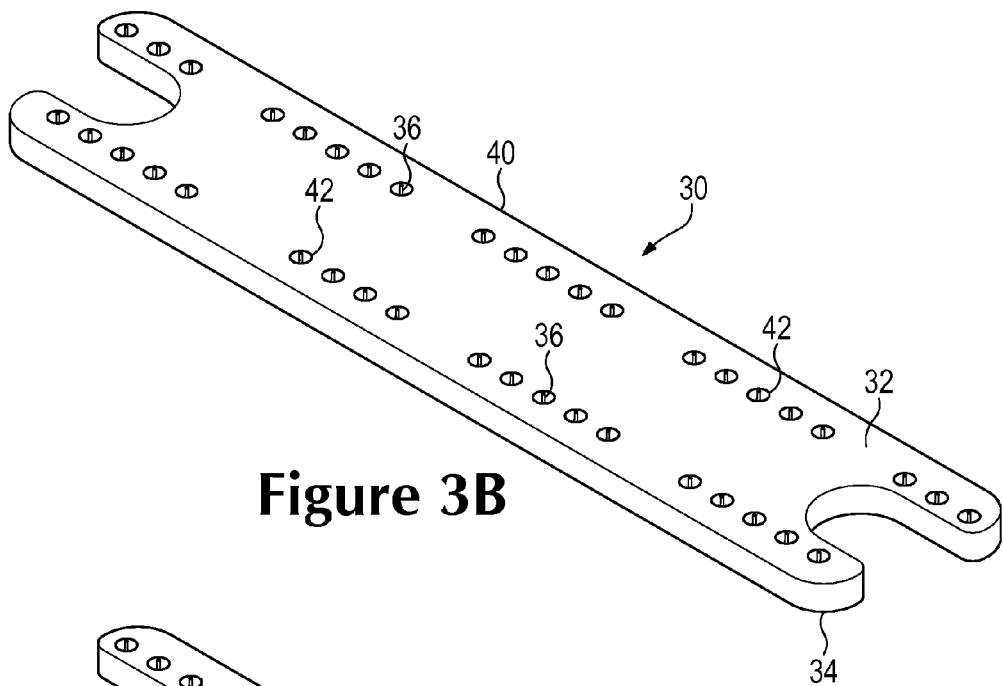
FIG. 3B is a perspective view of a second embodiment of an electrical contact assembly usable in a resistive probing tip system according to the present invention.

The resistive probing tip system according to the present invention has at least a first electrical contact assembly (first ECA) 30 as shown in FIGS. 3A and 3B. The electrical contact assembly 30 has opposing surfaces 32 and 34 with electrical contacts 36 exposed at the opposing surfaces 32, 34. Each electrical contact 36 exposed at one of the opposing surfaces 32, 34 is electrically coupled to a corresponding electrical contact 36 exposed at the other opposing surface. The electrical contacts 36 exposed at the opposing surfaces 32, 34 correspond to the electrical contacts 20 of the resistive elements 18, 22 exposed at the opposing surfaces 12, 14 of the carrier 10. In one embodiment, the electrical contact assembly 30 is formed of a flex circuit material 38 having corresponding electrical contacts 36 formed on the opposing surfaces 32, 34 and coupled together by electrically conductive through vias. Preferably, the flex circuit material 38 has a thickness on the order of 0.010 inches. In a second embodiment, the electrical contact assembly may be formed of an elastomeric material having electrically conductive contacts formed through the elastomeric material. In one design, multiple fine electrical wires form each of the electrical contacts with the fine electrical wires extending to the opposing surfaces 32, 34 of the electrical contact assembly 30. Preferably, the elastomeric material has a free height on the order of 0.039 inches and a compressed height of 0.031 inches. FIG. 3B show a further embodiment of the electrical contact assembly 30 where metal spring electrical contacts 36 are disposed in a housing 40 with the ends of the metal spring electrical contacts extending from apertures 42 formed in the opposing surfaces 32, 34 of the electrical contact assembly 30. An example of a metal spring electrical contacts usable in the electrical contact assembly 30 are RC Spring Probes manufactured and sold by Ardent Concepts, Inc., Hampton Beach, N.H. Preferably, the free height of the metal spring electrical contact is 0.036 inches. The compressed height is 0.031 inches which is set by the thickness of the housing 40 of the electrical contact assembly 30.

Figure 4:
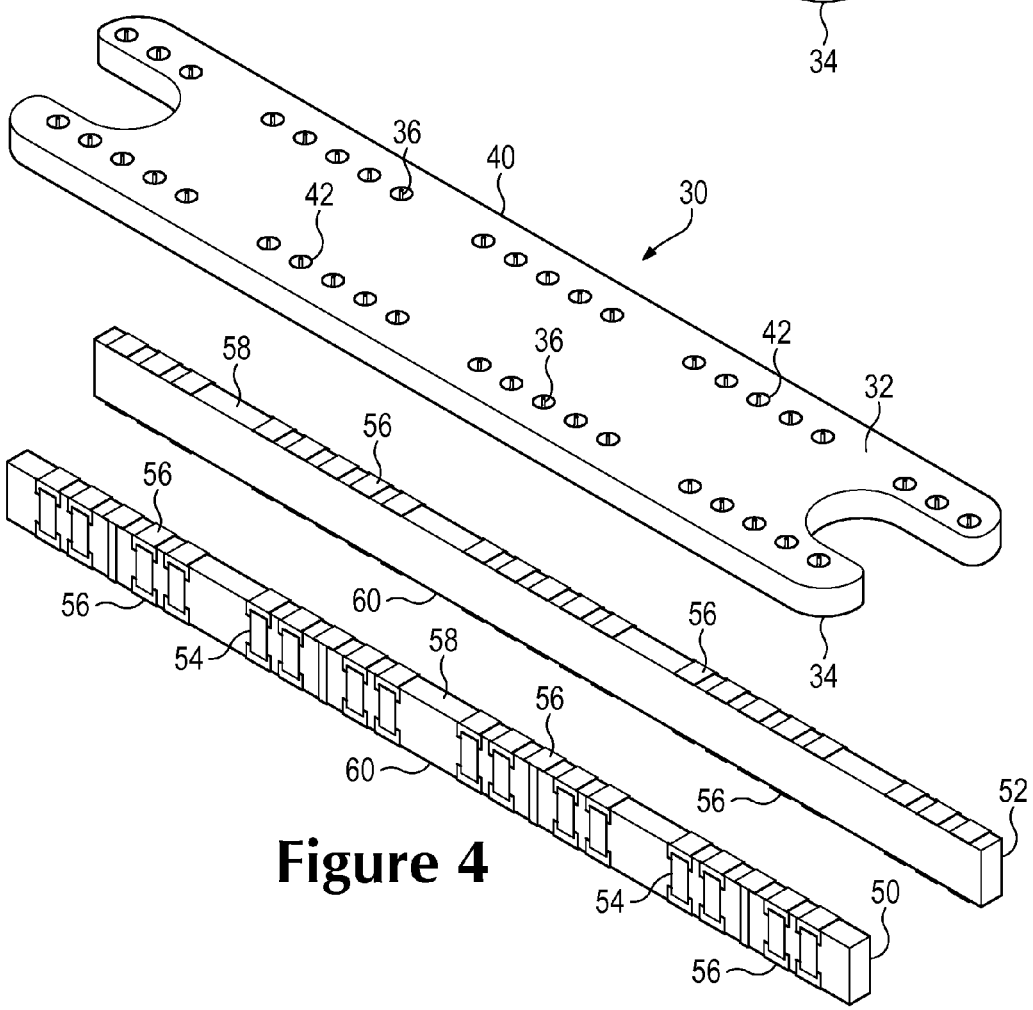
FIG. 4 an exploded perspective view of an electrical contact assembly and first and second carriers usable in a resistive probing tip system according to the present invention.

FIG. 4 show an alternative embodiment for the resistive probing tip system according to the present invention. The embodiment of FIG. 4 has first and second carriers 50 and 52. In one embodiment, the carriers 50, 52 are ceramic substrates having resistive elements 54 formed thereon. Electrical contacts 56 are formed on the ends of the resistive elements 54 with the electrical contacts 56 extending over the opposing side surfaces 58 and 60 of the ceramic substrate carriers 50, 52. The resistive elements 54 and electrical contacts 56 are formed using well-known thick film, thin film, or other technologies. In an alternate embodiment, the resistive elements 54 may be discrete resistors having opposing electrical contact 56 that are secured to a carrier 50, 52, such as a circuit board. The electrical contacts 56 of the discrete resistors 54 extend above opposing surfaces of the circuit board.

Referring to FIGS. 5A-5L, there are shown various configurations of the resistive probing tip system 62 according to the present invention. The carrier or carriers 10, 50, 52 and/or the first ECA 30 may be secured to a probe head 64 of a logic analyzer probe or secured to a circuit board 66 of a device under test. The probe head 64 has at least a first circuit board (not shown) having electrical contacts corresponding to the resistive elements 18, 22, 54 of the carrier or carriers 10, 50, 52. The electrical contacts 20, 56 exposed at one of the opposing surfaces 12, 14, 58, 60 of the carrier or carriers 10, 50, 52 selectively mate to and mate from the electrical contacts 36 exposed at one of the opposing surfaces 32, 34 of the first ECA 30. The electrical contacts 20, 56 exposed at the other of the opposing surface 12, 14, 58, 60 of the carrier or carriers 10, 50, 52 or the electrical contacts 36 exposed at the other of the opposing surfaces 32, 34 of the first ECA 30 selectively mate to and mate from the electrical contacts on the circuit board of the probe head 64. Likewise, the electrical contacts 20, 56 exposed at the other of the opposing surface 12, 14, 58, 60 of the carrier or carriers 10, 50, 52 or the electrical contacts 36 exposed at the other of the opposing surfaces 32, 34 of the first ECA 30 selectively mate to and mate from the electrical contacts on the circuit board 66 of the device under test. The capability of the carrier 10 or carriers 50, 52 and the first ECA 30 to selectively mate to and mate with one another and mate to and mate from the circuit board of the probe head 64 and/or the circuit board 66 of the device under test allows the selective replacement of the carrier or carriers and electrical contact assembly to be selectively replaced if one of them becomes inoperative.

Figure 5C:
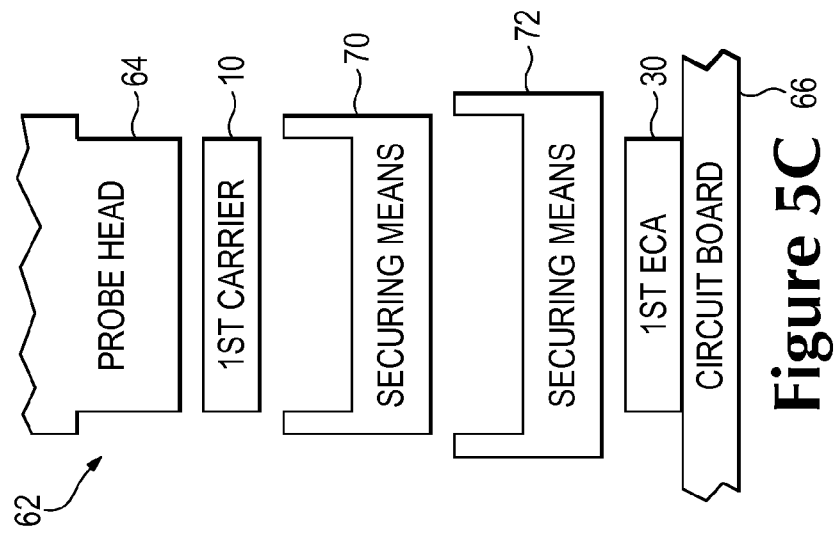
FIGS. 5A through 5L are various configurations using an electrical contact assembly and first or first and second carriers and in the resistive probing tip system according to the present invention.
Figure 5B:
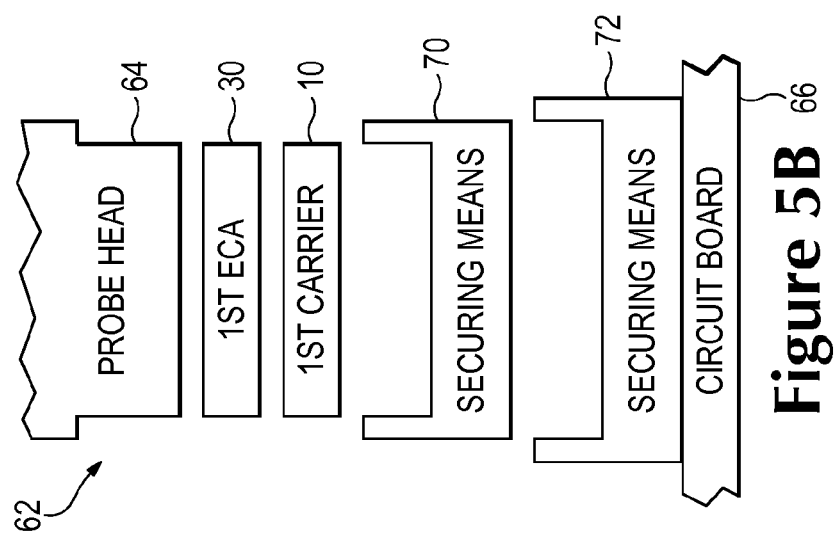
Figure 5A:
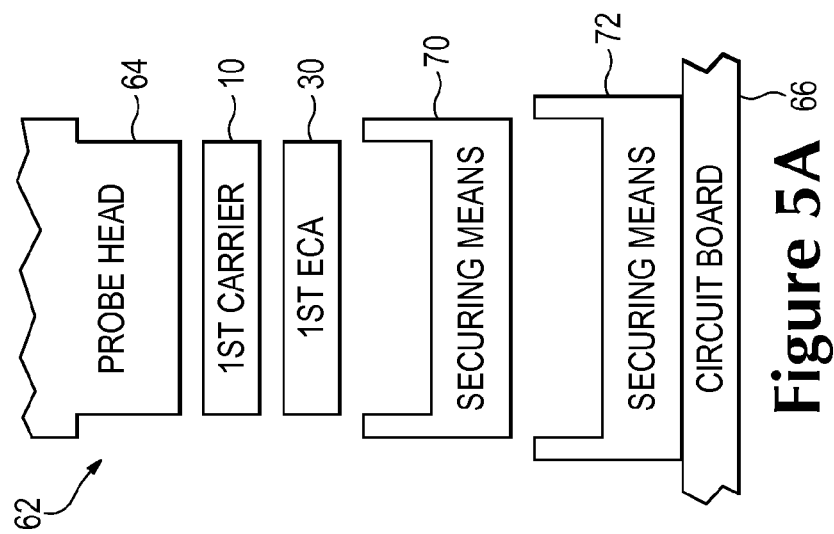

In FIG. 5A, the first carrier 10 and the first ECA 30 are secured to the probe head 64 by a housing 70 mating with the probe head 64. The electrical contacts 20 exposed at one of the opposing surfaces 12, 14 of the first carrier 10 contact the electrical contacts on the circuit board in the probe head 64. The electrical contacts 36 exposed at one of the opposing surfaces 32, 34 of the first ECA 30 contact the electrical contacts on the circuit board 66 of the device under test when the probe head 64 is secured to the circuit board 66 of the device under test using a securing means, such as a logic probe socket housing 72. The electrical contacts 20 exposed at the other of the opposing surfaces 12, 14 of the first carrier 10 contact corresponding electrical contacts 36 exposed at the other of the opposing surfaces 32, 34 of the first ECA 30.

In FIG. 5B, the positions of the first carrier 10 and the first ECA 30 are reversed. The electrical contacts 36 exposed at one of the opposing surfaces 32, 34 of the first ECA 30 contact the electrical contacts on the circuit board in the probe head 64. The electrical contacts 20 exposed at one of the opposing surfaces 12, 14 of the first carrier 10 contact the electrical contacts on the circuit board 66 of the device under test when the probe head 64 is inserted into the socket housing 72 on the circuit board 66. The electrical contacts 36 exposed at the other of the opposing surfaces 32, 34 of the first ECA 30 contact corresponding electrical contacts 20 exposed at the other of the opposing surfaces 12, 14 of the first carrier 10.

In FIG. 5C, the first carrier 10 is secured to the probe head 64 by the housing 70 and the first ECA 30 is secured to the circuit board 66 of the device under test by the socket housing 72. The electrical contacts 20 exposed at one of the opposing surfaces 12, 14 of the first carrier 10 contact the electrical contacts on the circuit board in the probe head 64. The electrical contacts 36 exposed at one of the opposing surfaces 32, 34 of the first ECA 30 contact the electrical contacts on the circuit board 66 of the device under test. The electrical contacts 20 exposed at the other of the opposing surfaces 12, 14 of the first carrier 10 contact corresponding electrical contacts 36 exposed at the other of the opposing surfaces 32, 34 of the first ECA 30 when the probe head 64 is inserted into the socket housing 72 on the circuit board 66.

Figure 5D:
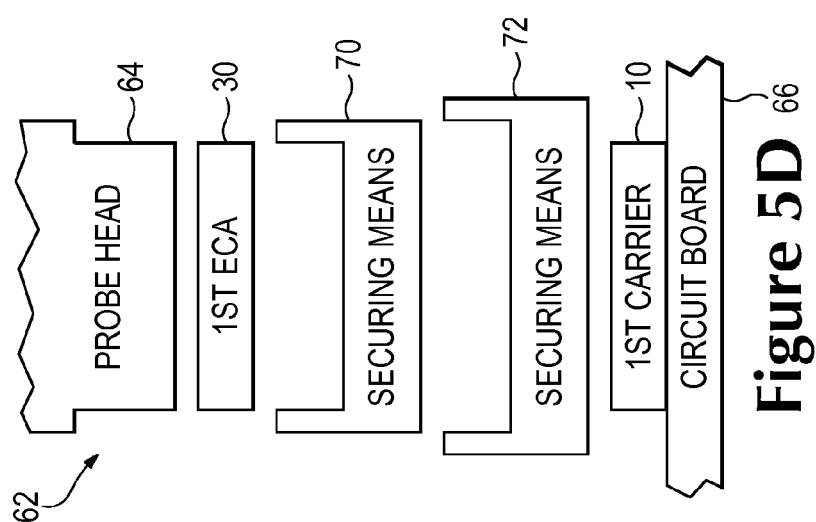

In FIG. 5D, the first ECA 30 is secured to the probe head 64 by the housing 70 and the first carrier 10 is secured to the circuit board 66 of the device under test by the socket housing 72. The electrical contacts 36 exposed at one of the opposing surfaces 32, 34 of the first ECA 30 contact the electrical contacts on the circuit board in the probe head 64. The electrical contacts 20 exposed at one of the opposing surfaces 12, 14 of the first carrier 10 contact the electrical contacts on the circuit board 66 of the device under test. The electrical contacts 36 exposed at the other of the opposing surfaces 32, 34 of the first ECA 30 contact corresponding electrical contacts 20 exposed at the other of the opposing surfaces 12, 14 of the first carrier 10 when the probe head 64 is inserted into the socket housing 72 on the circuit board 66.

Figure 5E:
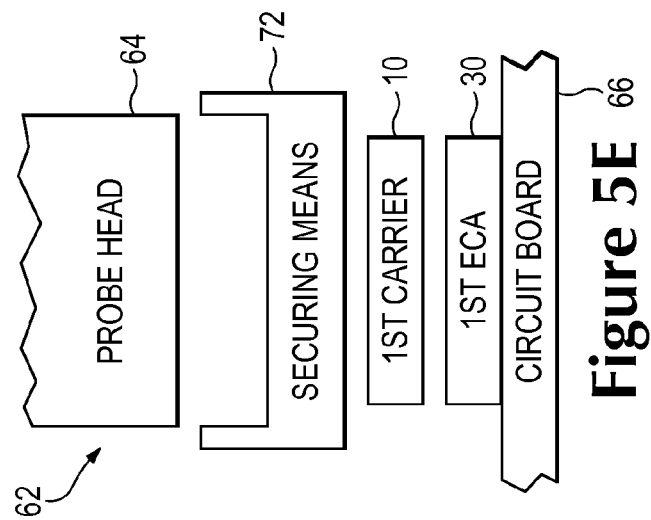

In FIG. 5E, the first carrier 10 and the first ECA 30 are secured to the circuit board 66 of the device under test by the socket housing 72. The electrical contacts 20 exposed at one of the opposing surfaces 12, 14 of the first carrier 10 contact the electrical contacts 36 exposed at the one of the opposing surfaces 32, 34 of the first ECA 30. The electrical contacts 36 exposed at the other of the opposing surfaces 32, 34 of the first ECA 30 contact the electrical contacts on the circuit board 66 of the device under test. The electrical contacts 20 exposed at the other of the opposing surfaces 12, 14 of the first carrier 10 contact corresponding the electrical contacts on the circuit board in the probe head 64 when the probe head 64 is inserted into the socket housing 72 on the circuit board 66.

Figure 5F:
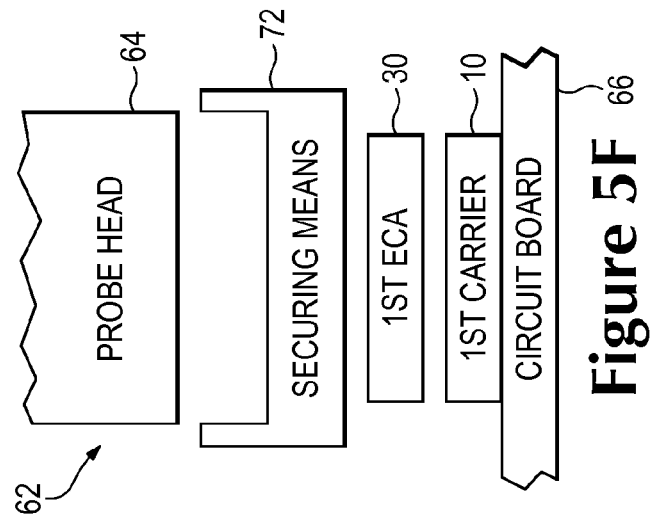

In FIG. 5F, the positions of the first carrier 10 and the first ECA 30 are reversed. The first ECA 30 and the first carrier 10 are secured to the circuit board 66 of the device under test by the socket housing 72. The electrical contacts 36 exposed at one of the opposing surfaces 32, 34 of the first ECA 30 contact the electrical contacts 20 exposed at the one of the opposing surfaces 12, 14 of the first carrier 10. The electrical contacts 20 exposed at the other of the opposing surfaces 12, 14 of the first carrier 10 contact the electrical contacts on the circuit board 66 of the device under test. The electrical contacts 36 exposed at the other of the opposing surfaces 32, 34 of the first ECA 30 contact corresponding the electrical contacts on the circuit board in the probe head 64 when the probe head 64 is inserted into the socket housing 72 on the circuit board 66.

Figure 5G:
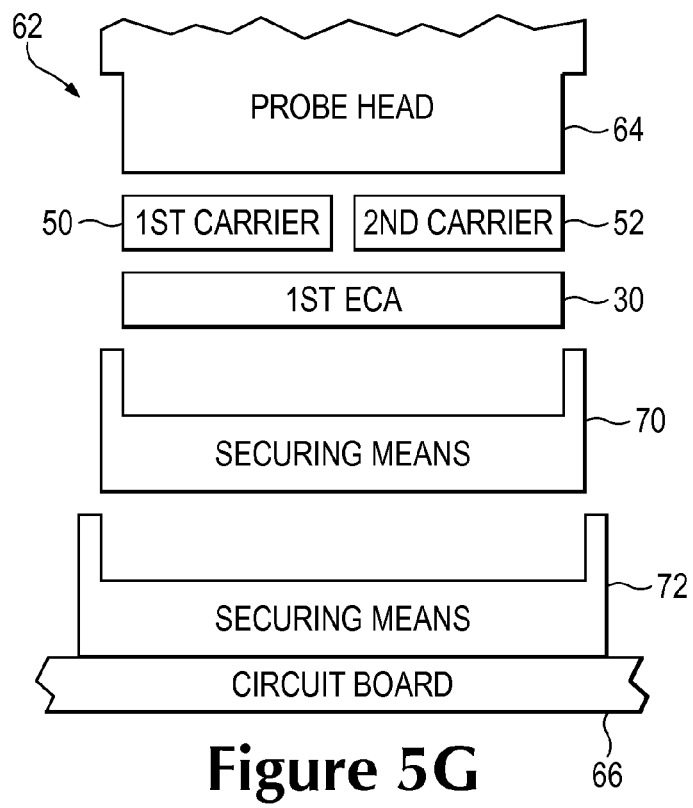

In FIG. 5G, first and second carriers 50, 52 and the first ECA 30 are secured to the probe head 64 by the housing 70 mating with the probe head 64. The electrical contacts 56 exposed at one of the opposing surfaces 58, 60 of the respective first and second carriers 50, 52 contact the electrical contacts on first and second circuit boards (not shown) in the probe head 64. The electrical contacts 56 exposed at the other opposing surfaces 58, 60 of the respective first and second carriers 50, 52 contact corresponding electrical contacts 36 on one of the opposing surfaces 32, 34 of the first ECA 30. The electrical contacts 36 exposed at the other of opposing surfaces 32, 34 of the first ECA 30 contact the electrical contacts on the circuit board 66 of the device under test when the probe head 64 is inserted into the socket housing 72 on the circuit board 66. As with the previous configurations, the probe head 64 is mounted to the circuit board 66 using a securing means, such as a logic probe socket 72.

Figure 5H:
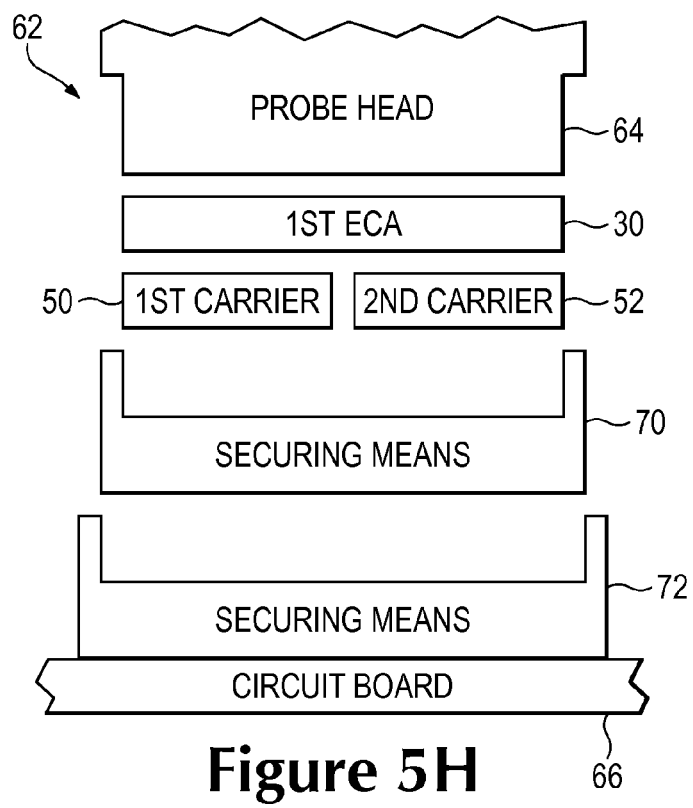

In FIG. 5H, the positions of the first and second carriers 50, 52 and the first ECA 30 are reversed. The electrical contacts 36 exposed at one of the opposing surfaces 32, 34 of the first ECA 30 contact the electrical contacts on the first and second circuit board in the probe head 64. The electrical contacts 36 exposed at the other of the opposing surfaces 32, 34 of the first ECA 30 contact corresponding electrical contacts 56 exposed at the other of the opposing surfaces 58, 60 of the respective the first and second carriers 50, 52. The electrical contacts 56 exposed at the other of the opposing surfaces 58, 60 of the respective first and second carriers 50, 52 contact the electrical contacts on the circuit board 66 of the device under test when the probe head 64 is inserted into the socket housing 72 on the circuit board 66.

Figure 5I:
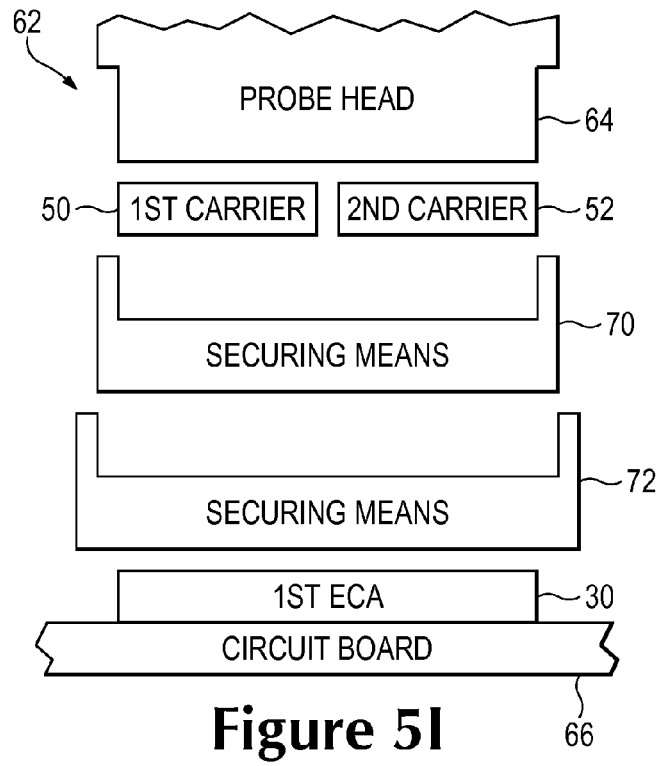

In FIG. 5I, the first and second carriers 50, 52 are secured to the probe head 64 by the housing 70 and the first ECA 30 is secured to the circuit board 66 of the device under test by the socket housing 72. The electrical contacts 56 exposed at one of the opposing surfaces 58, 60 of the respective first and second carriers 50, 52 contact the electrical contacts on the first and second circuit boards in the probe head 64. The electrical contacts 36 exposed at one of the opposing surfaces 32, 34 of the first ECA 30 contact the electrical contacts on the circuit board 66 of the device under test. The electrical contacts 56 exposed at the other of the opposing surfaces 58, 60 of the first and second carriers 50, 52 contact corresponding electrical contacts 36 exposed at the other of the opposing surfaces 32, 34 of the first ECA 30 when the probe head 64 is inserted into the socket housing 72 on the circuit board 66.

Figure 5J:
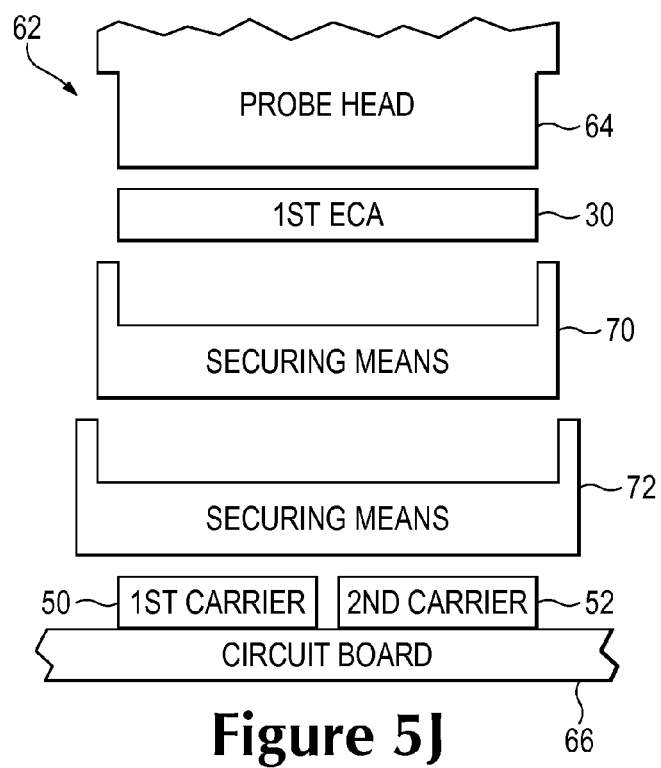

In FIG. 5J, the first ECA 30 is secured to the probe head 64 by the housing 70 and the first and second carriers 50, 52 are secured to the circuit board 66 of the device under test by the socket housing 72. The electrical contacts 36 exposed at one of the opposing surfaces 32, 34 of the first ECA 30 contact the electrical contacts on the first and second circuit board in the probe head 64. The electrical contacts 56 exposed at one of the opposing surfaces 58, 60 of the respective first and second carriers 50, 52 contact the electrical contacts on the circuit board 66 of the device under test. The electrical contacts 36 exposed at the other of the opposing surfaces 32, 34 of the first ECA 30 contact corresponding electrical contacts 56 exposed at the other of the opposing surfaces 58, 60 of the respective first and second carriers 50, 52 when the probe head 64 is inserted into the socket housing 72 on the circuit board 66.

Figure 5K:
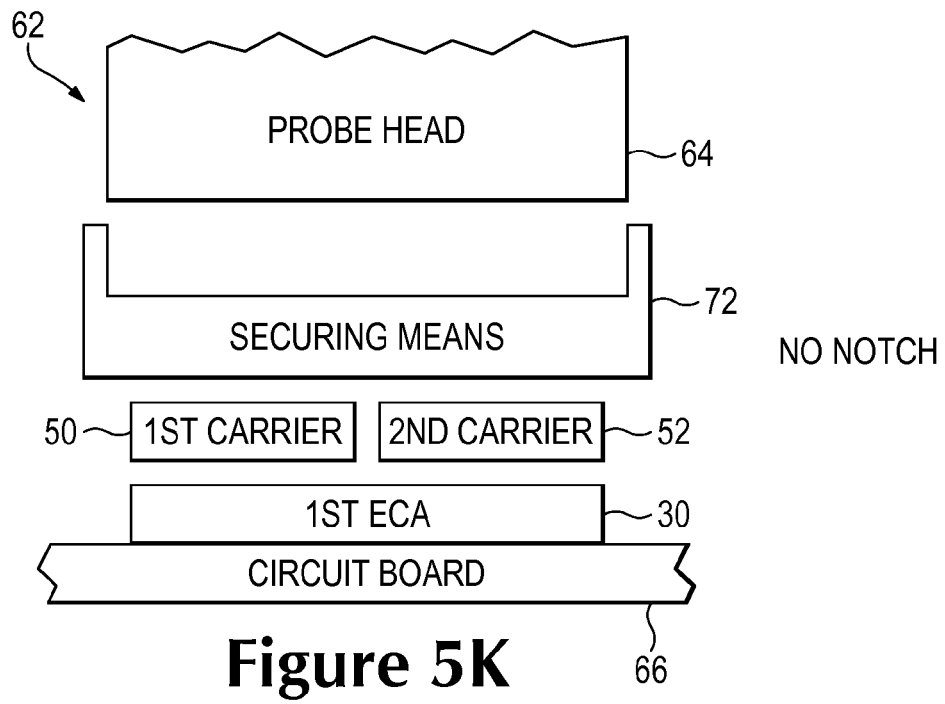

In FIG. 5K, the first and second carriers 50, 52 and the first ECA 30 are secured to the circuit board 66 of the device under test by the socket housing 72. The electrical contacts 56 exposed at one of the opposing surfaces 58, 60 of the first and second carriers 50, 52 contact corresponding electrical contacts 36 exposed at one of the opposing surfaces 32, 34 of the first ECA 30. The electrical contacts 36 exposed at the other of the opposing surfaces 32, 34 of the first ECA 30 contact the electrical contacts on the circuit board 66 of the device under test. The electrical contacts 56 exposed at the other of the opposing surfaces 58, 60 of the respective first and second carriers 50, 52 contact the electrical contacts on first and second circuit boards in the probe head 64 when the probe head 64 is inserted into the socket housing 72 on the circuit board 66.

Figure 5L:
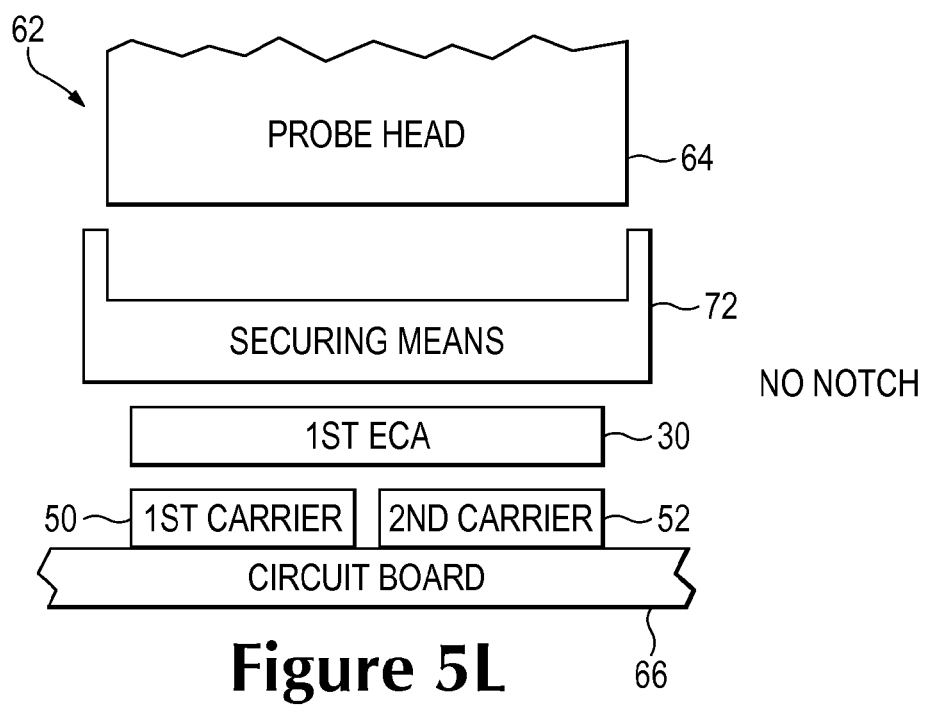

In FIG. 5L, the first ECA 30 and the first and second carriers 50, 52 are secured to the circuit board 66 of the device under test by the socket housing 72. The electrical contacts 36 exposed at one of the opposing surfaces 32, 34 of the first ECA 30 contact corresponding electrical contacts 56 exposed at one of the opposing surfaces 58, 60 of the first and second carriers 50, 52. The electrical contacts 56 exposed at the other of the opposing surfaces 58, 60 of the respective first and second carriers 50, 52 contact the electrical contacts on the circuit board 66 of the device under test. The electrical contacts 36 exposed at the other of the opposing surfaces 32, 34 of the first ECA 30 contact the electrical contacts on the first and second circuit boards of the probe head 64 when the probe head 64 is inserted into the socket housing 72 on the circuit board 66.

Figure 6A:
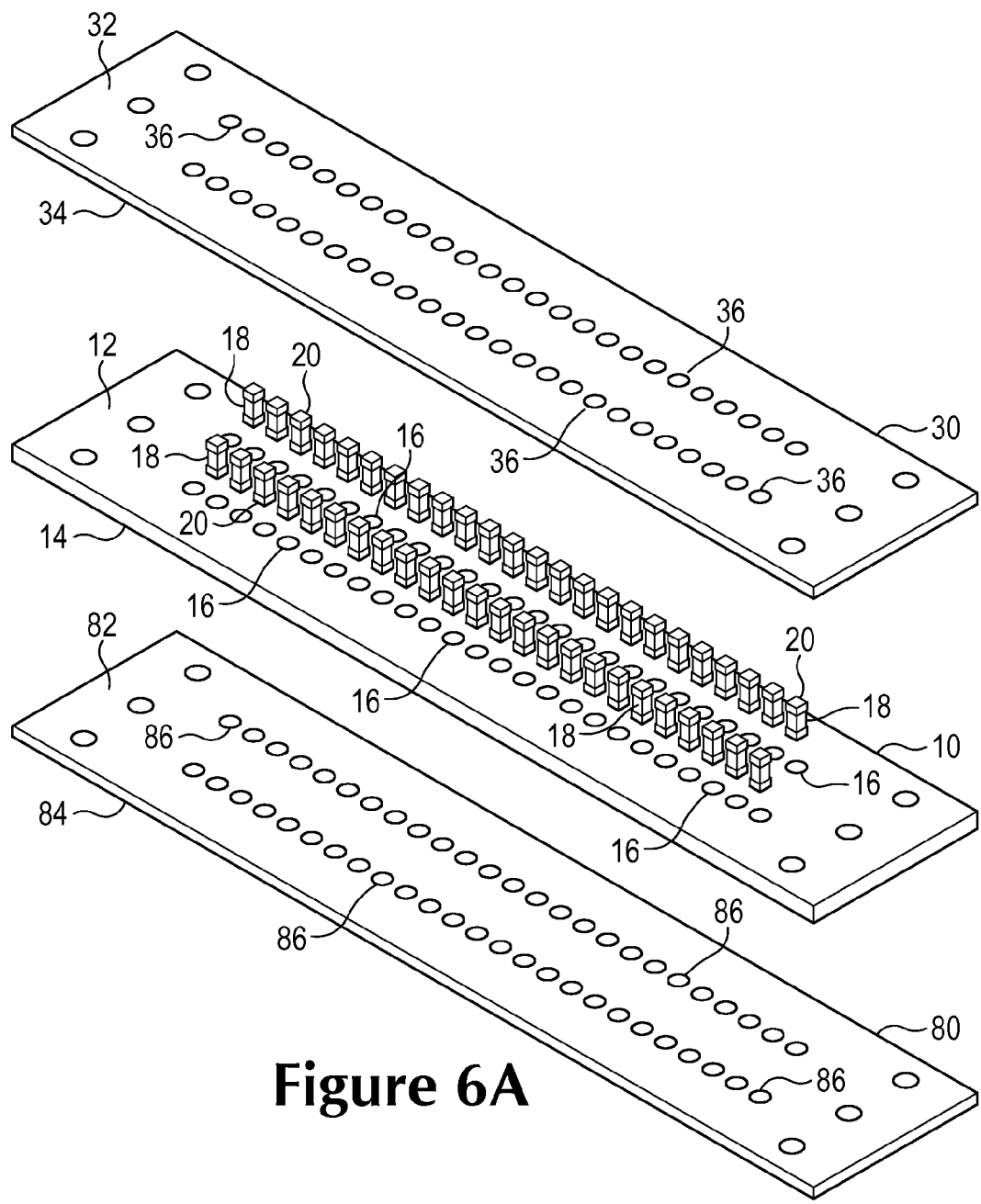
FIGS. 6A through 6C are exploded perspective views of a carrier and first and second electrical contact assemblies usable in a resistive probing tip system according to the present invention.
Figure 6B:
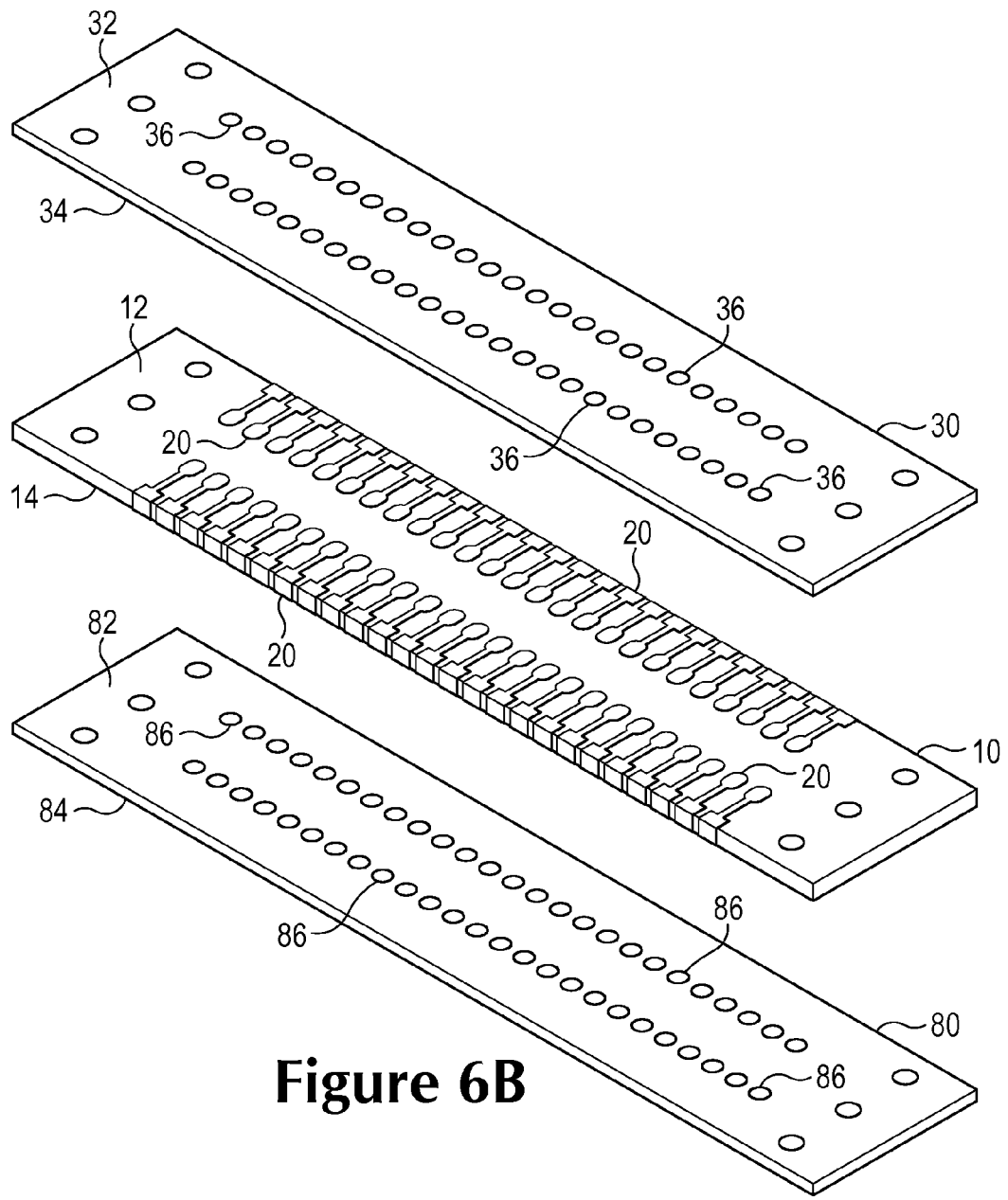
Figure 6C:
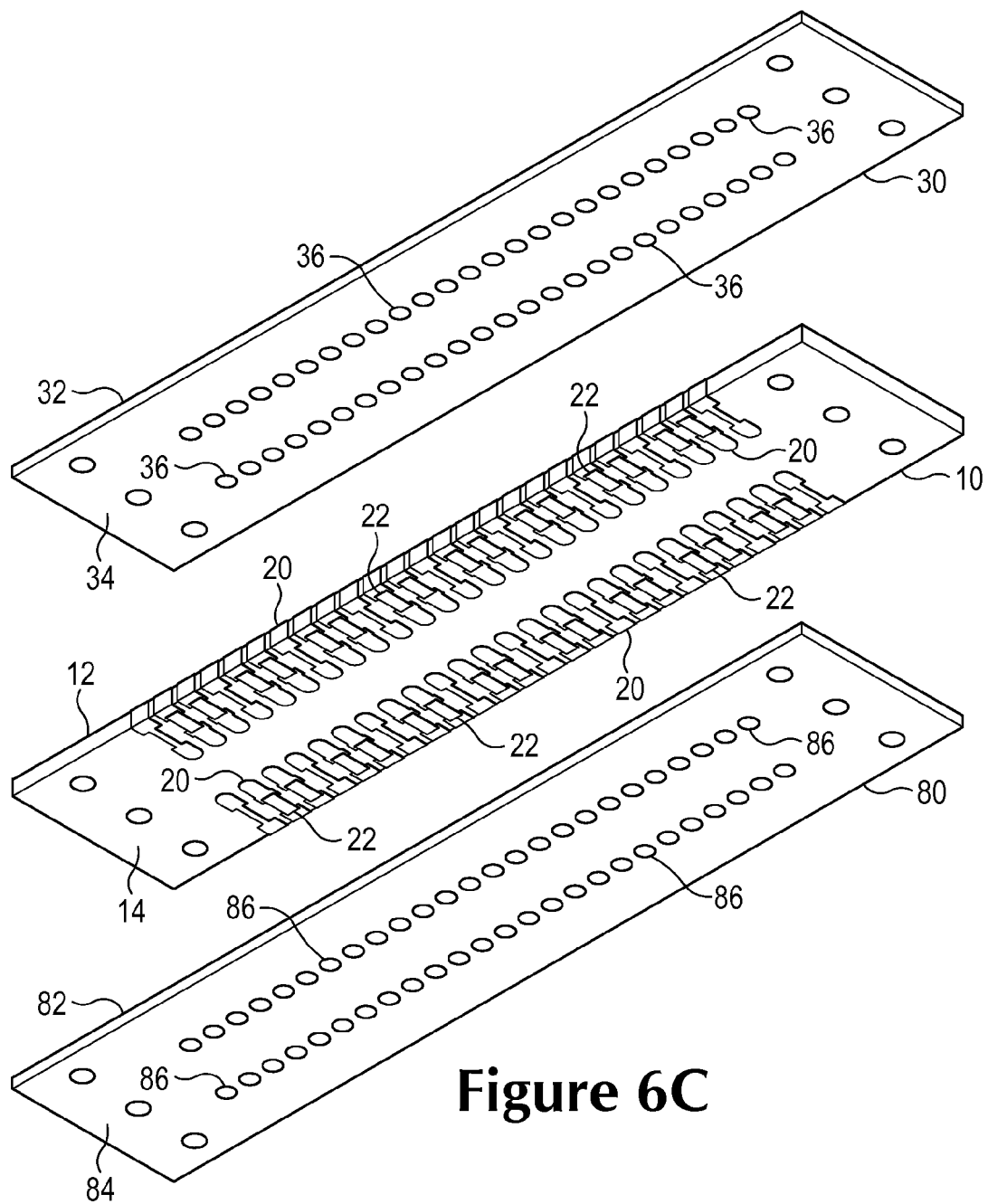

FIGS. 6A, 6B and 6C show further configurations of the resistive probing tip system 62 according to the present invention. FIG. 6A show the carrier 10 of FIG. 1 disposed between the first ECA 30 and a second electrical contact assembly (second ECA) 80. The carrier 10 has opposing surface 12, 14 with discrete resistors 18 disposed in apertures 16 formed in the carrier 10. Electrical contacts 20 formed on the opposing ends of the discrete resistors 18 are exposed at the opposing surfaces 12, 14. FIGS. 6B and 6C show perspective top and bottom views of the previously described ceramic substrate carrier 10 disposed between the first ECA 30 and the second ECA 80. The ceramic substrate carrier 10 has opposing surfaces 12, 14 with electrical contacts 20 formed on the opposing surfaces. Resistive elements 22 are formed on the ceramic substrate carrier 10 with each resistive element 22 having one end connected to one of the electrical contacts 20 on one of the opposing surfaces 12, 14 and the other end of each resistive element 22 connected to one of the electrical contacts 20 on the other opposing surface 12, 14 of the ceramic substrate carrier 10. The second ECA 80 has opposing surfaces 82 and 84 with electrical contacts 86 being exposed at the opposing surfaces 82, 84. Each electrical contact 86 exposed at one of the opposing surfaces 82, 84 of the second ECA 80 is electrically coupled to a corresponding electrical contact 86 exposed at the other opposing surface 82, 84. The second ECA 80 is formed in the same manner as previously described for the first ECA 30.

The electrical contacts 20 exposed at the opposing surfaces 12, 14 of the first carrier 10 selectively mate to and mate from the electrical contacts 36 exposed at one of the opposing surfaces 32, 34 of the first ECA 30 and the electrical contacts 86 exposed at one of the opposing surfaces 82, 84 of the second ECA 80. The electrical contacts 20 exposed at one of the opposing surface 12, 14 of the carrier 10 or the electrical contacts 36 exposed at one of opposing surfaces 32, 34 of the first ECA 30 selectively mate to and mate from the electrical contacts on the circuit board of the probe head 64. Likewise, the electrical contacts 20 exposed at one of the opposing surface 12, 14 of the carrier 10 or the electrical contacts 86 exposed at one of the opposing surfaces 82, 84 of the second ECA 80 selectively mate to and mate from the electrical contacts on the circuit board 66 of the device under test.

FIGS. 7A-7L show various configurations of the resistive probing tip system 62 according to the present invention having the first ECA 30 and second ECA 80. In these configurations, the first carrier 10, the first ECA 30 and the second ECA 80 may be secured to the probe head 64 of a logic analyzer probe or secured to the circuit board 66 of a device under test. Further configurations include one of the first ECA 30 or the first carrier 10 being secured to the probe head 64 of a logic analyzer probe or secured to the circuit board 66 of a device under test. Also, the first carrier 10 or one of the first ECA 30 and the second ECA 80 may be secured to the probe head 64 or to the circuit board 66 of the device under test.

In FIGS. 7A, 7B and 7C the first carrier 10, the first ECA 30 and second ECA 80 are secured to the probe head 64 by the housing 70 mating with the probe head 64. In FIG. 7A, the electrical contacts 36 exposed at one of the opposing surfaces 32, 34 of the first ECA 30 contact the electrical contacts on the circuit board in the probe head 64. The electrical contacts 86 exposed at one of the opposing surfaces 82, 84 of the second ECA 80 contact the electrical contacts on the circuit board 66 of the device under test when the probe head 64 is inserted into the socket housing 72 on the circuit board 66. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact the electrical contacts 86 exposed at the other of the opposing surfaces 82, 84 of the second ECA 80.

In FIG. 7B, the positions of the first carrier 10 and the second ECA 80 are reversed. The electrical contacts 36 exposed at one of the opposing surfaces 32, 34 of the first ECA 30 contact the electrical contacts on the circuit board in the probe head 64. The electrical contacts 20 exposed at one of the opposing surfaces 12, 14 of the first carrier 10 contact the electrical contacts on the circuit board 66 of the device under test when the probe head 64 is inserted into the socket housing 72 on the circuit board 66. The electrical contacts 86 exposed at one of the opposing surfaces 82, 84 of the second ECA 80 contact corresponding electrical contacts 36 exposed at the other of the opposing surfaces 32, 34 of the first ECA 30. The electrical contacts 86 exposed at the other of the opposing surfaces 82, 84 of the second ECA 80 contact corresponding electrical contacts 20 exposed at the other of the opposing surfaces 12, 14 of the first carrier 10.

In FIG. 7C, the first carrier 10 is position adjacent to the probe head. The electrical contacts 20 exposed at one of the opposing surfaces 12, 14 of the first carrier 10 contact the electrical contacts on the circuit board in the probe head 64. The electrical contacts 86 exposed at one of the opposing surfaces 82, 84 of the second ECA 80 contact the electrical contacts on the circuit board 66 of the device under test when the probe head 64 is inserted into the socket housing 72 on the circuit board 66. The electrical contacts 36 exposed at one of the opposing surfaces 32, 34 of the first ECA 30 contact corresponding electrical contacts 20 exposed at the other of the opposing surfaces 12, 14 of the first carrier 10. The electrical contacts 36 exposed at the other of the opposing surfaces 32, 34 of the first ECA 30 contact corresponding electrical contacts 86 exposed at the other of the opposing surface 82, 84 of the second ECA 80.

In FIGS. 7D, 7E and 7F, the first carrier 10, the first ECA 80 and second ECA 80 are secured to the circuit board 66 of the device under test by the socket housing 72. In FIG. 7D, the electrical contacts 36 exposed at one of the surfaces 32, 34 of the first ECA 30 contact the electrical contacts on the circuit board in the probe head 64 when the probe head 64 is inserted into the socket housing 72 on the circuit board 66. The electrical contacts 86 exposed at one of the opposing surfaces 82, 84 of the second ECA 80 contact the electrical contacts on the circuit board 66 of the device under test. The electrical contacts 20 exposed at one of the opposing mating surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at the other of the opposing surfaces 82, 84 of the second ECA 80.

In FIG. 7E, the first ECA 30 and the first carrier 10 are reversed. The electrical contacts 20 exposed at one of the surfaces 12, 14 of the first carrier 10 contact the electrical contacts on the circuit board in the probe head 64 when the probe head 64 is inserted into the socket housing 72 on the circuit board 66. The electrical contacts 86 exposed at one of the opposing surfaces 82, 84 of the second ECA 80 contact the electrical contacts on the circuit board 66 of the device under test. The electrical contacts 36 exposed at one of the opposing surfaces 32, 34 of the first ECA 30 contact corresponding electrical contacts 20 exposed at the other of the opposing surfaces 12, 14 of the first carrier 10. The electrical contacts 36 exposed at the other of the opposing surfaces 32, 34 of the first ECA 30 contact corresponding electrical contacts 86 exposed at the other of the opposing surfaces 82, 84 of the second ECA 80.

In FIG. 7F, the first carrier 10 is positioned on the circuit board 66 of the device under test. The electrical contacts 36 exposed at one of the opposing surfaces 32, 34 of the first ECA 30 contact the electrical contacts on the circuit board in the probe head 64 when the probe head 64 is inserted into the socket housing 72 on the circuit board 66. The electrical contacts 20 exposed at one of the opposing surfaces 12, 14 of the first carrier 10 contact the electrical contacts on the circuit board 66 of the device under test. The electrical contacts 86 exposed at one of the opposing surfaces 82, 84 of the second ECA 80 contact corresponding electrical contacts 30 exposed at the other of the opposing surfaces 32, 34 of the first ECA 30. The electrical contacts 86 exposed at the other of the opposing surfaces 82, 84 of the second ECA 80 contact corresponding electrical contacts 20 exposed at the other of the opposing surfaces 12, 14 of the first carrier 10.

In FIG. 7G, the first ECA 30 and the first carrier 10 are secured to the probe head 64 by the housing 70 mating with the probe head 64 and the second ECA 80 is secured to the circuit board 66 of the device under test by the socket housing 72. The electrical contacts 36 exposed at one of the opposing surfaces 32, 34 of the first ECA 30 contact the electrical contacts on the circuit board of the probe head 64. The electrical contact 86 exposed at one of the opposing surfaces 82, 84 of the second ECA 80 contact the electrical contacts on the circuit board 66 of the device under test. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at the other of the opposing surfaces 82, 84 of the second ECA 80 when the probe head 64 is inserted into the socket housing 72 on the circuit board 66.

In FIG. 7H, the positions of the first carrier 10 and the first ECA 30 are reversed. The electrical contacts 20 exposed at one of the opposing surfaces 12, 14 of the first carrier 10 contact the electrical contacts on the circuit board of the probe head 64. The electrical contacts 86 exposed at one of the opposing surfaces 82, 84 of the second ECA 80 contact the electrical contacts on the circuit board 66 of the device under test. The electrical contacts 36 exposed at one of the opposing surfaces 32, 34 of the first ECA 30 contact corresponding electrical contacts 20 exposed at the other of the opposing surfaces 12, 14 of the first carrier 10. The electrical contacts 36 exposed at the other of the opposing surfaces 32, 34 of the first ECA 30 contact corresponding electrical contacts 86 exposed at the other of the opposing surfaces 82, 84 of the second ECA 80 when the probe head 64 is inserted into the socket housing 72 on the circuit board 66.

In FIG. 7I, first ECA 30 and the second ECA 80 are secured to the probe head 64 by the housing 70 mating with the probe head 64 and the first carrier 10 is secured to the circuit board 66 of the device under test by the socket housing 72. The electrical contacts 36 exposed at one of the opposing surfaces 32, 34 of the first ECA 30 contact the electrical contacts on the circuit board of the probe head 64. The electrical contacts 20 exposed at one of the opposing surfaces 12, 14 of the first carrier 10 contact the electrical contacts on the circuit board 66 of the device under test. The electrical contacts 86 exposed at one of the opposing surfaces 82, 84 of the second ECA 80 contact corresponding electrical contacts 36 exposed at the other of the opposing surfaces 32, 34 of the first ECA 30. The electrical contacts 86 exposed at the other of the opposing surfaces 82, 84 of the second ECA 80 contact corresponding electrical contacts 20 exposed at the other of the opposing surfaces 12, 14 of the first carrier 10 when the probe head 64 is inserted into the socket housing 72 on the circuit board 66.

In FIG. 7J, the first ECA 30 is secured to the probe head 64 by the housing 70 mating with the probe head 64 and the first carrier 10 and the second ECA 80 are secured to the circuit board 66 of the device under test by the socket housing 72. The electrical contacts 36 exposed at one of the opposing surfaces 32, 34 of the first ECA 30 contact the electrical contacts on the circuit board of the probe head 64. The electrical contacts 86 exposed at one of the opposing surfaces 82, 84 of the second ECA 80 contact the electrical contacts on the circuit board 66 of the device under test. The electrical contacts 20 exposed at one of the opposing surfaces 12, 14 of the first carrier 10 contact corresponding electrical contacts 36 exposed at the other of the opposing surfaces 32, 34 of the first ECA 30 when the probe head 64 is inserted into the socket housing 72 on the circuit board 66. The electrical contacts 20 exposed at the other of the opposing surfaces 12, 14 of the first carrier 10 contact corresponding electrical contacts 86 exposed at the other of the opposing surfaces 82, 84 of the second ECA 80.

In FIG. 7K, the positions of the first carrier 10 and the second ECA 80 are reversed. The electrical contacts 36 exposed at one of the opposing surfaces 32, 34 of the first ECA 30 contact the electrical contacts on the circuit board of the probe head 64. The electrical contacts 20 exposed at one of the opposing surfaces 12, 14 of the first carrier 10 contact the electrical contacts on the circuit board 66 of the device under test. The electrical contacts 86 exposed at one of the opposing surfaces 82, 84 of the second ECA 80 contact corresponding electrical contacts 36 exposed at the other of the opposing surfaces 32, 34 of the first ECA 30 when the probe head 64 is inserted into the socket housing 72 on the circuit board 66. The electrical contacts 86 exposed at the other of the opposing surfaces 82, 84 of the second ECA 80 contact corresponding electrical contacts 20 exposed at the other of the opposing surfaces 12, 14 of the first carrier 10.

In FIG. 7L, the first carrier 10 is secured to the probe head 64 by the housing 70 mating with the probe head 64 and the first ECA 30 and the second ECA 80 are secured to the circuit board 66 of the device under test by the socket housing 72. The electrical contacts 20 exposed at one of the opposing surfaces 12, 14 of the carrier 10 contact the electrical contacts on the circuit board of the probe head 64. The electrical contacts 86 exposed at one of the opposing surfaces 82, 84 of the second ECA 80 contact the electrical contacts on the circuit board 66 of the device under test. The electrical contacts 36 exposed at one of the opposing surfaces 32, 34 of the first ECA 30 contact corresponding electrical contacts 20 exposed at the other of the opposing surfaces 12, 14 of the first carrier 10 when the probe head 64 is inserted into the socket housing 72 on the circuit board 66. The electrical contacts 36 exposed at the other of the opposing surfaces 32, 34 of the first ECA 30 contact corresponding electrical contacts 86 exposed at the other of the opposing surfaces 82, 84 of the second ECA 80.

Figure 8A:
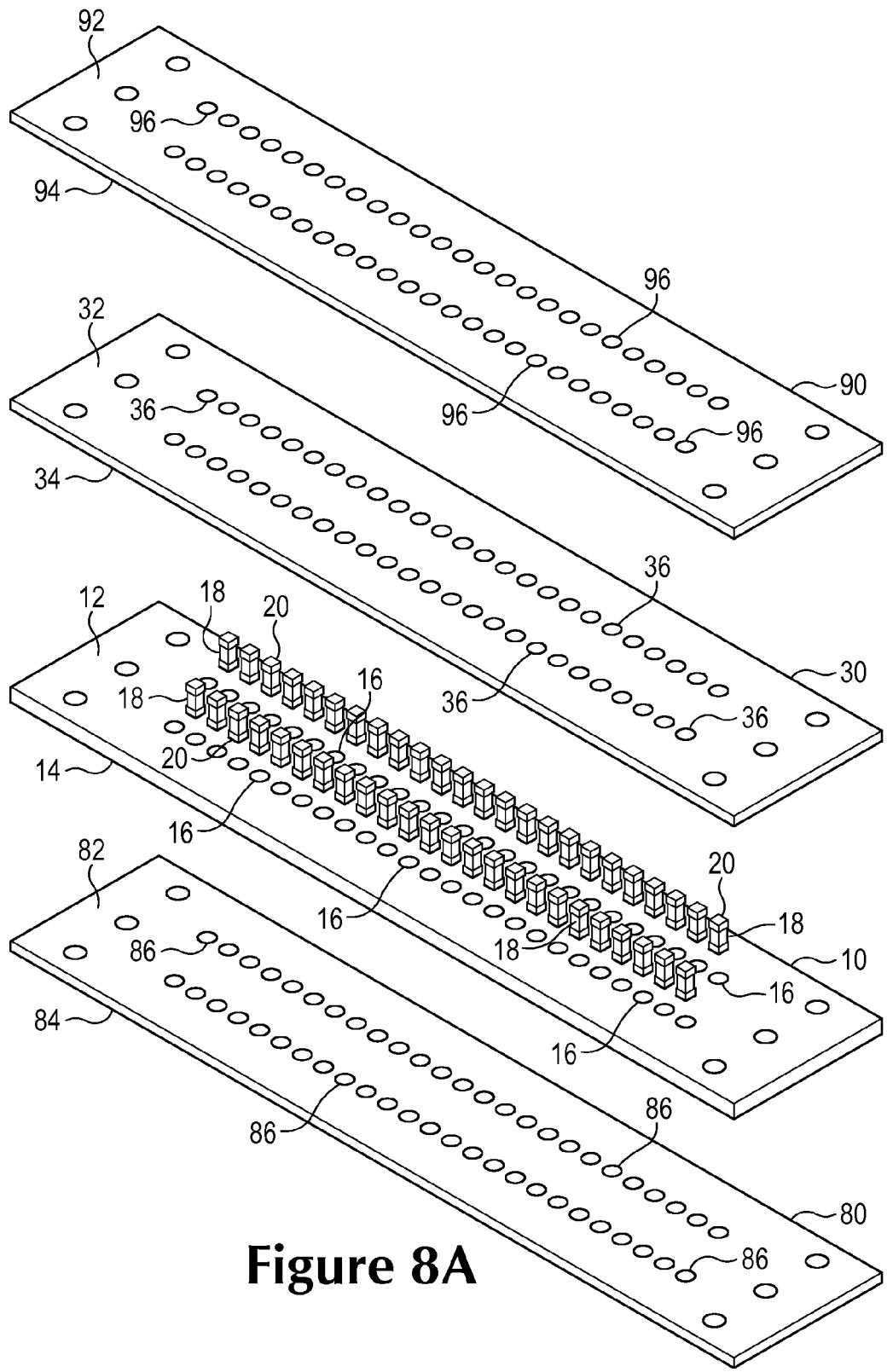
FIGS. 8A through 8C are exploded perspective views of a carrier and first, second and third electrical contact assemblies usable in a resistive probing tip system according to the present invention.
Figure 8B:
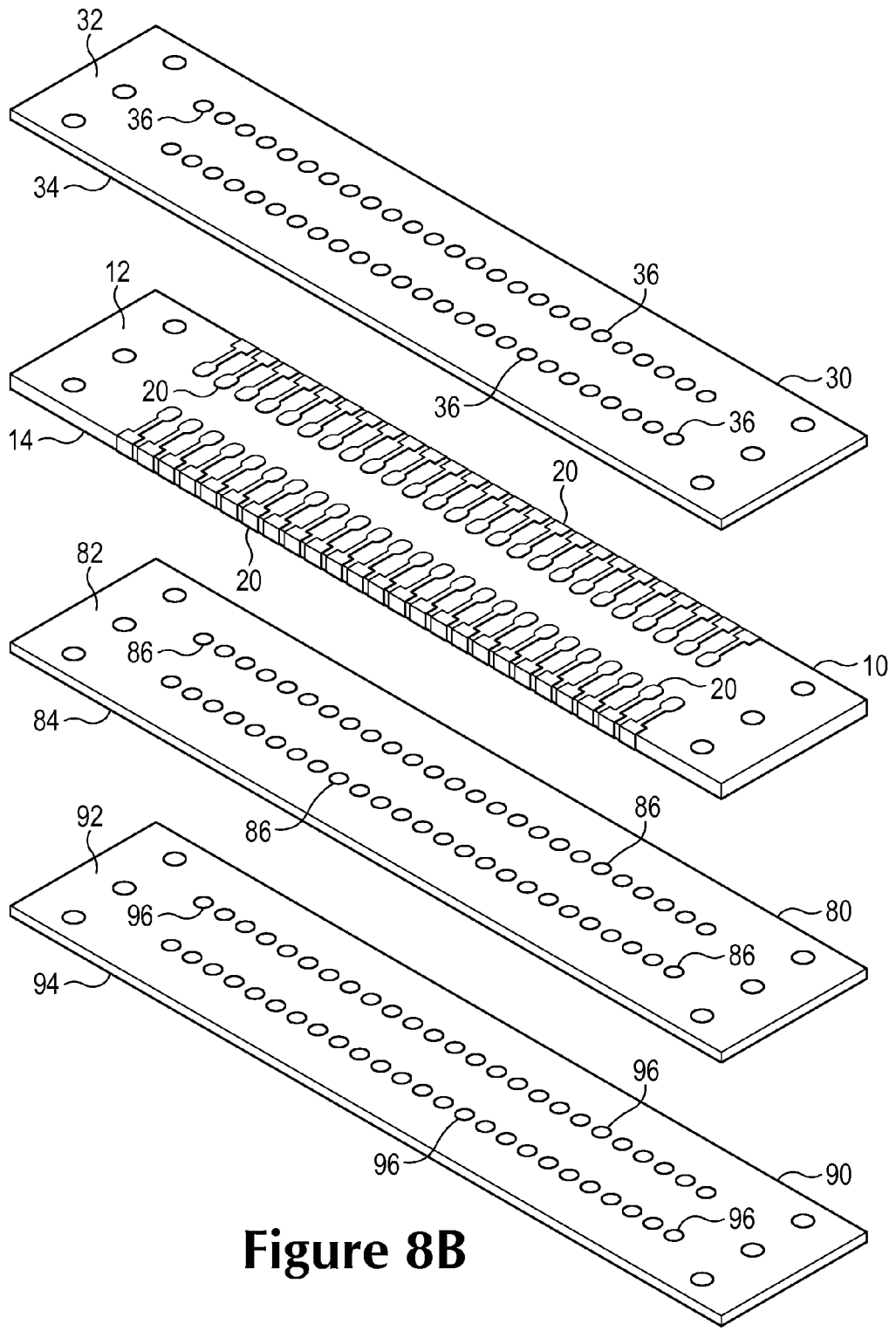
Figure 8C:
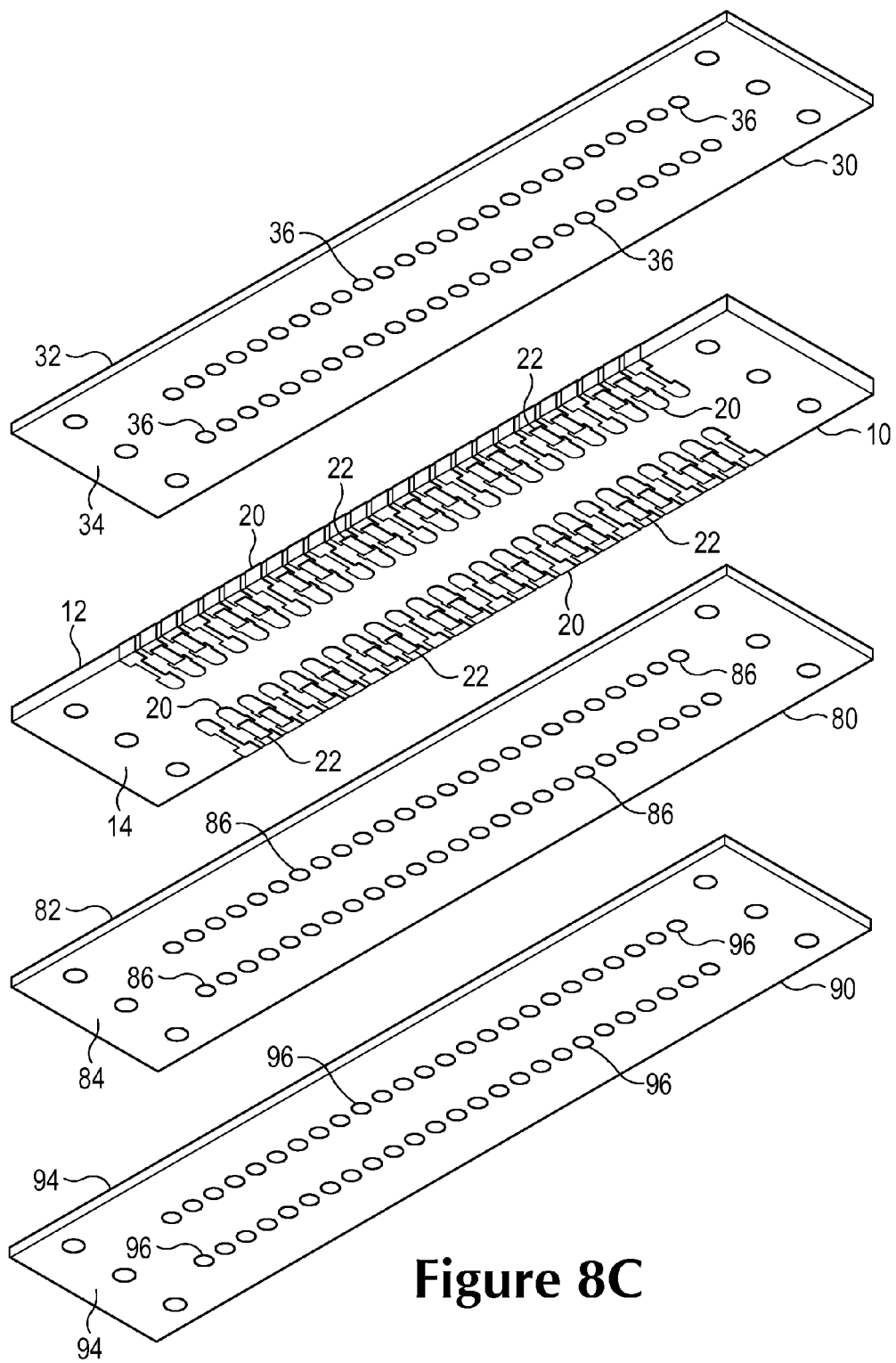

FIGS. 8A, 8B and 8C show a further configuration of the resistive probing tip system 62 according to the present invention having a third electrical contact assembly (third ECA) 90. The third ECA 90 has opposing surfaces 92 and 94 with electrical contacts 96 being exposed at the opposing surfaces 92, 94. Each electrical contact 96 exposed at one of the opposing surfaces 92, 94 of the third ECA 90 is electrically coupled to a corresponding electrical contact 96 exposed at the other opposing surface 92, 94. The third ECA 90 is formed in the same manner as previously described for the first ECA 30. The third ECA 90 is preferably positioned so that the electrical contacts 96 exposed at one of the opposing surfaces 92, 94 selectively mate to and mate from the electrical contacts 36 exposed at one of the opposing surfaces 32, 34 of the first ECA 30, as shown in FIG. 8A, or the corresponding electrical contacts 86 exposed at one of the opposing surfaces 82, 84 of the second ECA 80, as shown in FIGS. 8B and 8C. The electrical contacts 96 exposed at one of the opposing surface 92, 94 of the third ECA 90 may selectively mate to and mate from the electrical contacts on the circuit board of the probe head 64 or the electrical contacts on the circuit board 66 of the device under test.

FIGS. 9A-9J show various configurations of the resistive probing tip system 62 according to the present invention having the third ECA 90. In these configurations, the first carrier 10, the first ECA 30, the second ECA 80 and the third ECA 90 may be secured to the probe head 64 of a logic analyzer probe or secured to the circuit board 66 of a device under test. Further configurations include the carrier 10 and the first ECA 30 and the second ECA 80 being secured to the probe head 64 of the logic analyzer probe and the third ECA 90 secured to the circuit board 66 of the device under test. Additional configurations secure the first ECA 30 or the third ECA 90 to the probe head 64 of the logic analyzer probe and secure the corresponding first carrier 10, the second ECA 80 and the third ECA 90 or the carrier 10, the first ECA 30 and the second ECA 80 to the circuit board 66 of the device under test. Also, the first carrier 10 and the first ECA 30 or the first ECA 30 and third ECA 90 may be secured to the probe head 64 of the logic analyzer probe and the corresponding second ECA 80 and the third ECA 90 or the first carrier 10 and the second ECA 80 may be secured to the circuit board 66 of the device under test.

In FIGS. 9A and 9B the first carrier 10, the first ECA 30, the second ECA 80 and the third ECA 90 are secured to the probe head 64 by the housing 70 mating with the probe head 64. In FIG. 9A, the electrical contacts 36 exposed at one of the opposing surfaces 32, 34 of the first ECA 30 contact the electrical contacts on the circuit board in the probe head 64. The electrical contacts 96 exposed at one of the opposing surfaces 92, 94 of the third ECA 90 contact the electrical contacts on the circuit board 66 of the device under test when the probe head 64 is inserted into the socket housing 72 on the circuit board 66. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 96 exposed at the other of the opposing surfaces 92, 94 of the third ECA 90.

In FIG. 9B, the third ECA 90 is positioned above the first ECA 30. The electrical contacts 96 exposed at one of the opposing surfaces 92, 94 of the third ECA 90 contact the electrical contacts on the circuit board in the probe head 64. The electrical contacts 86 exposed at one of the opposing surfaces 82, 84 of the second ECA 80 contact the electrical contacts on the circuit board 66 of the device under test when the probe head 64 is inserted into the socket housing 72 on the circuit board 66. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at the other of the opposing surfaces 82, 84 of the second ECA 80.

Figure 9F:
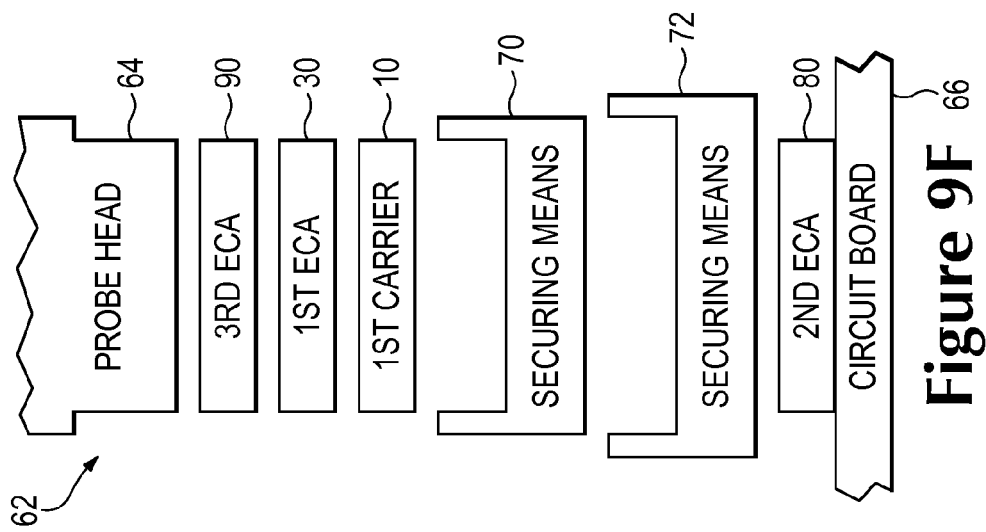
Figure 9E:
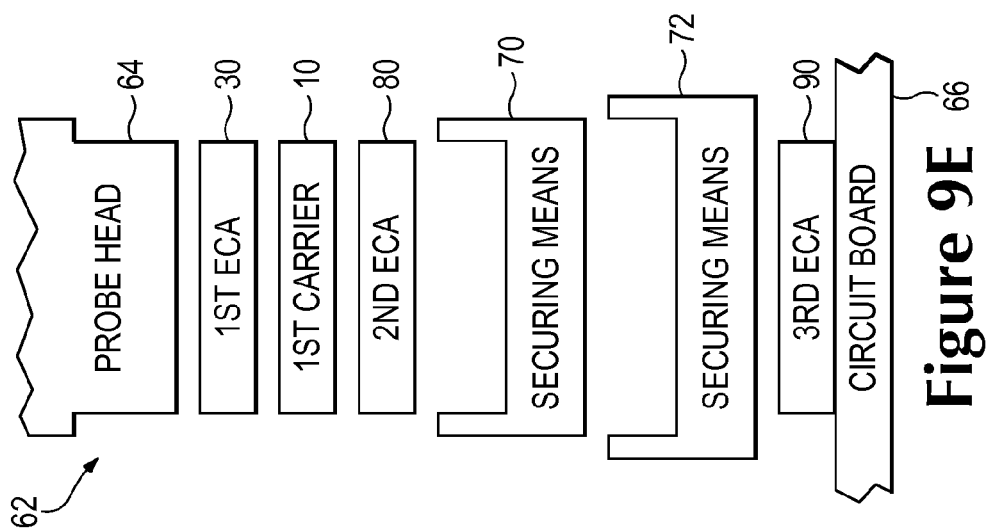
Figure 9D:
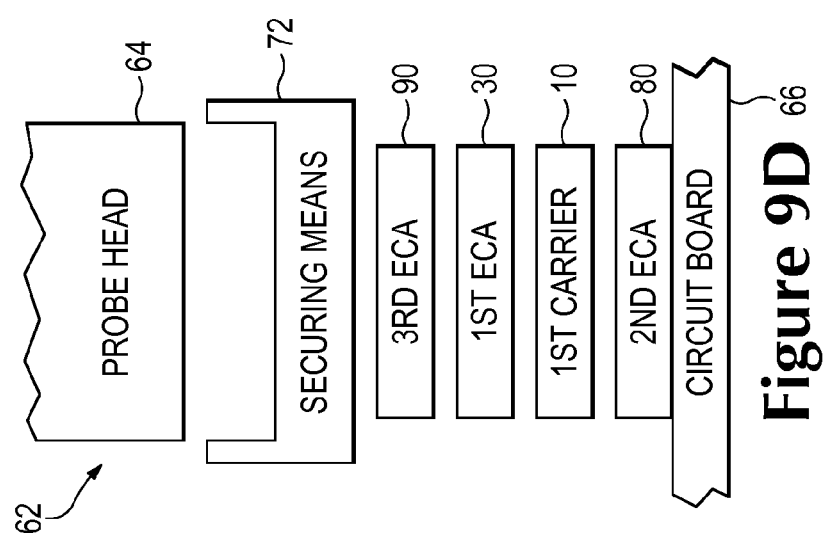

In FIGS. 9C and 9D the first carrier 10, the first ECA 30, the second ECA 80 and the third ECA 90 are secured to the circuit board 66 of the device under test by the socket housing 72. In FIG. 9C, the electrical contacts 36 exposed at one of the opposing surfaces 32, 34 of the first ECA 30 contact the electrical contacts on the circuit board in the probe head 64 when the probe head 64 is inserted into the socket housing 72 on the circuit board 66 of the device under test. The electrical contacts 96 exposed at one of the opposing surfaces 92, 94 of the third ECA 90 contact the electrical contacts on the circuit board 66 of the device under test. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts exposed at the other of the opposing surfaces 92, 94 of the third ECA 90.

In FIG. 9D, the third ECA 90 is positioned above the first ECA 30. The electrical contacts 96 exposed at one of the opposing surfaces 92, 94 of the third ECA 90 contact the electrical contacts on the circuit board in the probe head 64 when the probe head 64 is inserted into the socket housing 72 on the circuit board 66. The electrical contacts 86 exposed at one of the opposing surfaces 82, 84 of the second ECA 80 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at the other of the opposing surfaces 82, 84 of the second ECA 80.

In FIG. 9E, the first carrier 10, the first ECA 30 and the second ECA 80 are secured to the probe head 64 by the housing 70 and the third ECA 90 is secured to the circuit board 66 of the device under test by the socket housing 72. The electrical contacts 36 exposed at one of the opposing surfaces 32, 34 of the first ECA 30 contact the electrical contacts on the circuit board in the probe head 64. The electrical contacts 96 exposed at one of the opposing surfaces 92, 94 of the third ECA 90 contact the electrical contacts on the circuit board 66 of the device under test. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts exposed at the other of the opposing surfaces 92, 94 of the third ECA 90 when the probe head 64 is inserted into the socket housing 72 on the circuit board 66.

In FIG. 9F, the third ECA 90 is positioned above the first ECA 30 with the first carrier 10, the first ECA 30 and the third ECA 90 secured to the probe head 64 by the housing 70 and the second ECA 80 secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 86 exposed at one of the opposing surfaces 82, 84 of the second ECA 80 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at the other of the opposing surfaces 82, 84 of the second ECA 80 when the probe head 64 is inserted into the socket housing 72 on the circuit board 66.

In FIG. 9G, the carrier 10 and the first ECA 30 are secured to the probe head 64 by the housing 70 and the second ECA 80 and the third ECA 90 are secured to the circuit board 66 of the device under test by the socket housing 72. The electrical contacts 36 exposed at one of the opposing surfaces 32, 34 of the first ECA 30 contact the electrical contacts on the circuit board in the probe head 64. The electrical contacts 96 exposed at one of the opposing surfaces 92, 94 of the third ECA 90 contact the electrical contacts on the circuit board 66 of the device under test. The electrical contacts 86 exposed at one of the opposing surfaces 82, 84 of the second ECA 80 contact corresponding electrical contacts 96 exposed at the other of the opposing surfaces 92, 94 of the third ECA 90. The electrical contacts 20 exposed at one of the opposing surfaces 12, 14 of the first carrier 10 contact corresponding electrical contacts 36 exposed at the other of the opposing surfaces 32, 34 of the first ECA 30. The electrical contacts 20 exposed at the other of the opposing surfaces 12, 14 of the first carrier 10 contact corresponding electrical contacts 86 exposed at the other of the opposing surfaces 82, 84 of the second ECA 80 when the probe head 64 is inserted into the socket housing 72 on the circuit board 66.

In FIG. 9H, the first ECA 30 and the third ECA 90 are secured to the probe head 64 by the housing and the first carrier 10 and the second ECA 80 are secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 86 exposed at one of the opposing surfaces 82, 84 of the second ECA 80 contact the electrical contacts on the circuit board 66 of the device under test. The electrical contacts 20 exposed at one of the opposing surfaces 12, 14 of the first carrier 10 contact corresponding electrical contacts 86 exposed at the other of the opposing surfaces of the second ECA 80. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at the other of the opposing surfaces 12, 14 of the carrier 10 when the probe head 64 is inserted into the socket housing 72 on the circuit board 66.

In FIG. 9I, the first ECA 30 is secured to the probe head 64 by the housing 70 and the first carrier 10, the second ECA 80 and the third ECA 90 are secured to the circuit board 66 of the device under test by the socket housing 72. The electrical contacts 36 exposed at one of the opposing surfaces 32, 34 of the first ECA 30 contact the electrical contacts on the circuit board in the probe head 64. The electrical contacts 96 exposed at one of the opposing surfaces 92, 94 of the third ECA 90 contact the electrical contacts on the circuit board 66 of the device under test. The electrical contacts 86 exposed at one of the opposing surfaces 82, 84 of the second ECA 80 contact corresponding electrical contacts 96 exposed at the other of the opposing surfaces 92, 94 of the third ECA 90. The electrical contacts 86 exposed at the other of the opposing surfaces 82, 84 of the second ECA 80 contact corresponding electrical contact 20 exposed at one of the of the opposing surfaces 12, 14 of the first carrier 10. The electrical contacts 20 exposed at the other of the opposing surfaces 12, 14 of the first carrier 10 contact corresponding electrical contact 36 exposed at the other of the opposing surfaces 32, 34 of the first ECA 30 when the probe head 64 is inserted into the socket housing 72 on the circuit board 66.

In FIG. 9J, the third ECA 90 is secured to the probe head 64 by the housing 70 and the first carrier 10, the first ECA 30 and the second ECA 80 are secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 86 exposed at one of the opposing surfaces 82, 84 of the second ECA 80 contact the electrical contacts on the circuit board 66 of the device under test. The electrical contacts 20 exposed at one of the opposing surfaces 12, 14 of the first carrier 10 contact corresponding electrical contacts 86 exposed at the other of the opposing surfaces 82, 84 of the second ECA 80. The electrical contacts 20 exposed at the other of the opposing surfaces 12, 14 of the first carrier 10 contact corresponding electrical contact 36 exposed at one of the of the opposing surfaces 32, 34 of the first ECA 30. The electrical contacts 36 exposed at the other of the opposing surfaces 32, 34 of the first ECA 30 contact corresponding electrical contacts 96 exposed at the other of the opposing surfaces 92, 94 of the third ECA 90 when the probe head 64 is inserted into the socket housing 72 on the circuit board 66.

Figure 10A:
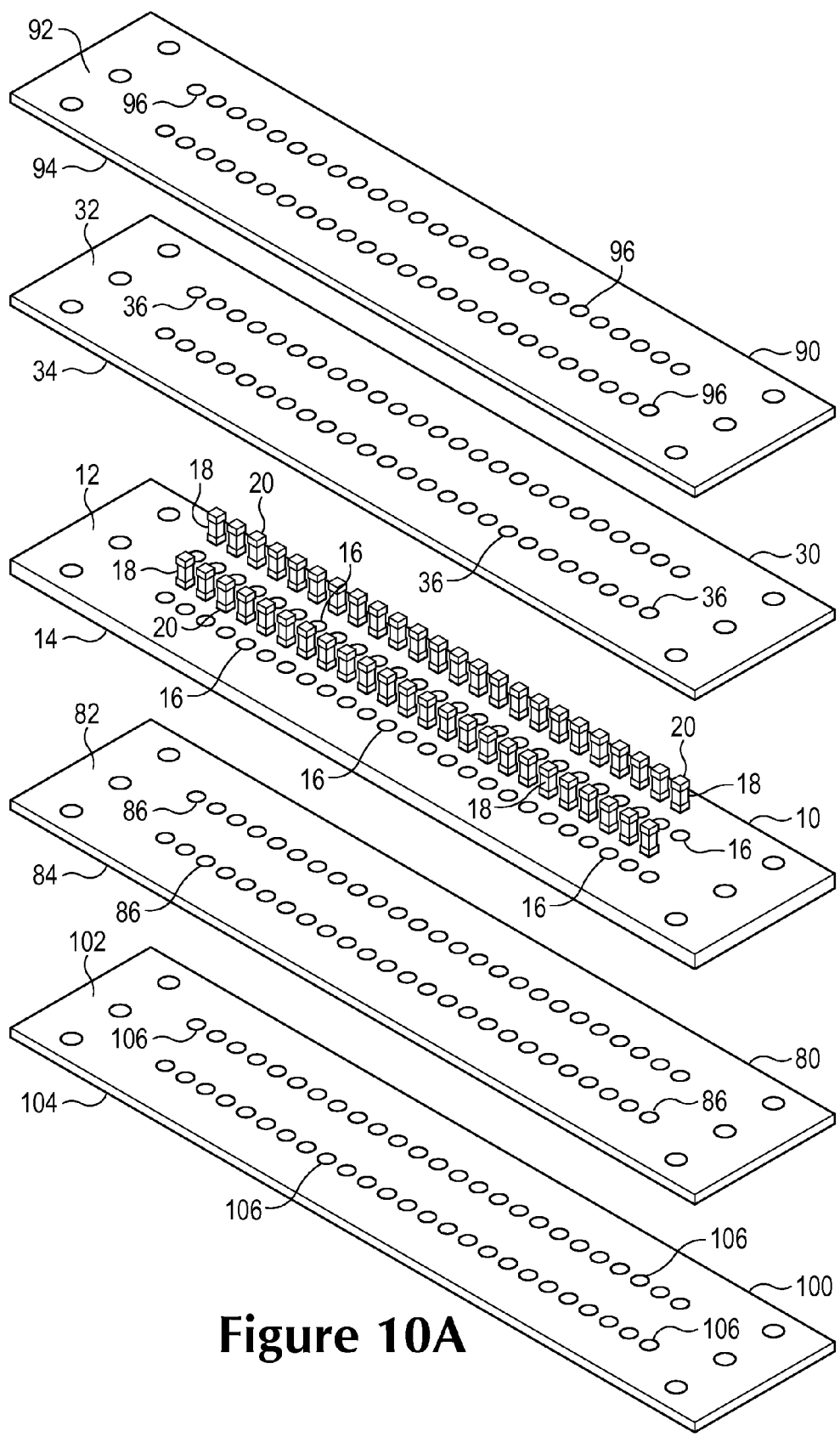
FIGS. 10A through 10C are exploded perspective views of a carrier and first, second, third and fourth electrical contact assemblies usable in a resistive probing tip system according to the present invention.
Figure 10B:
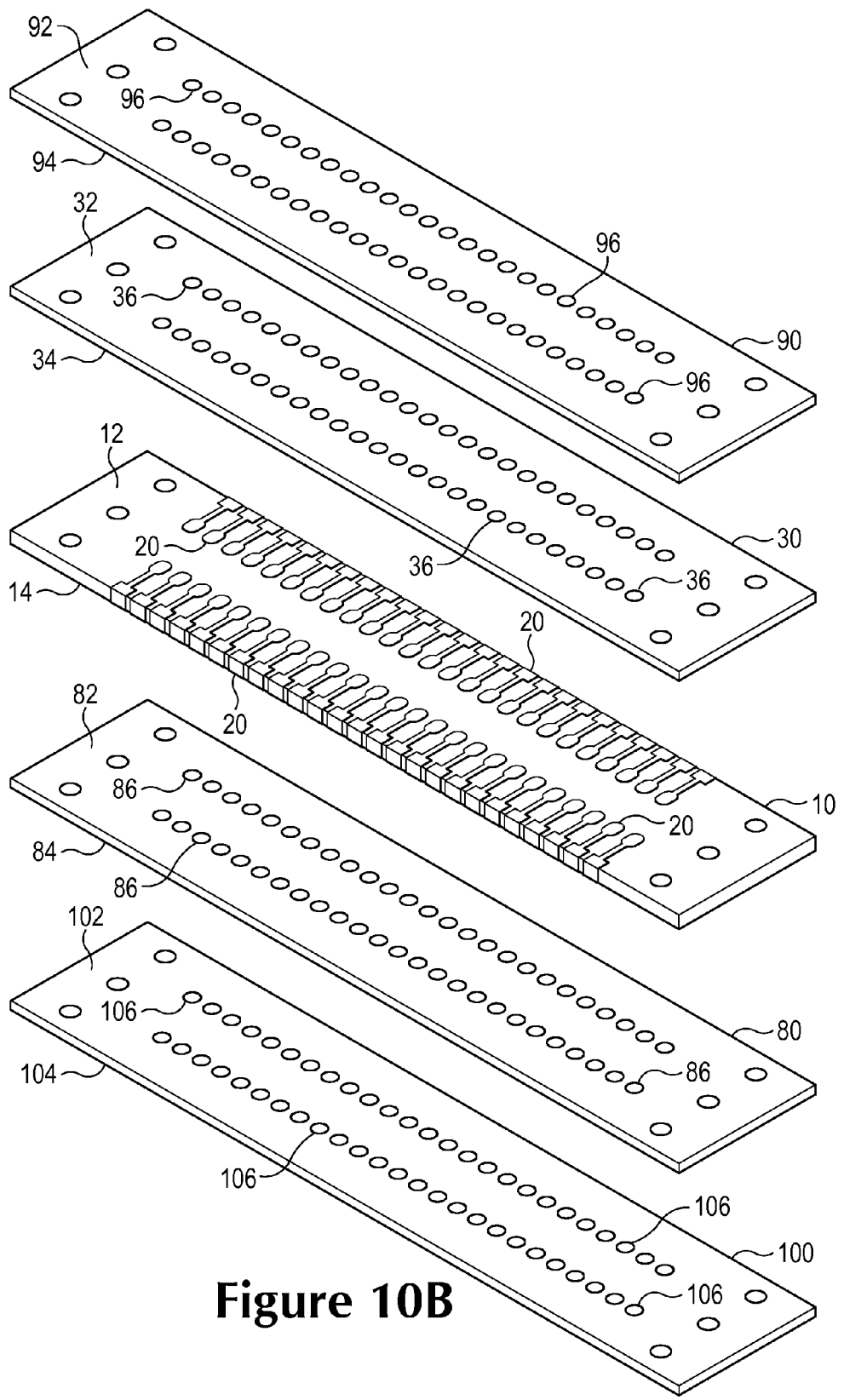
Figure 10C:
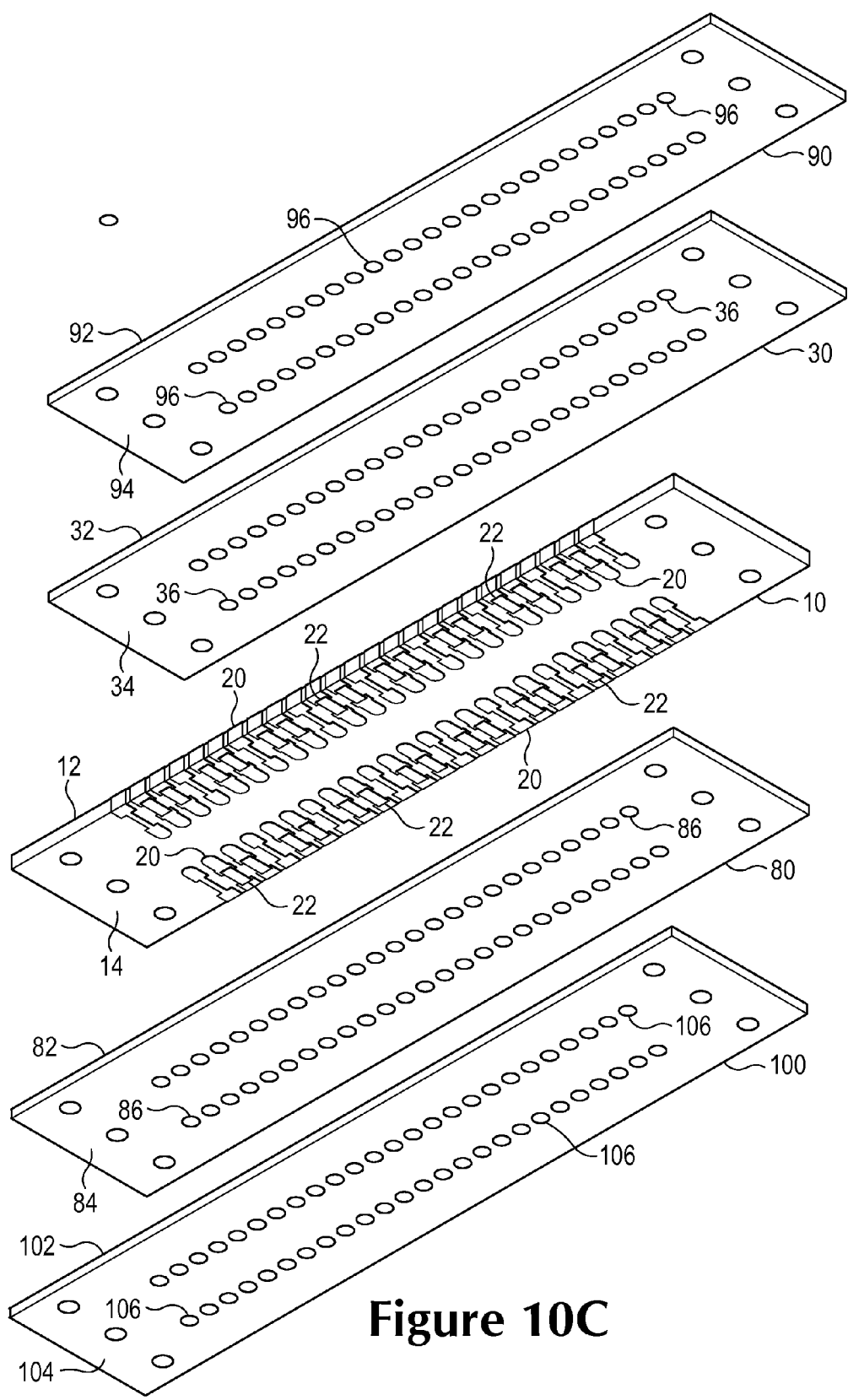

FIGS. 10A, 10B and 10C show a further configuration of the resistive probing tip system 62 according to the present invention having a fourth electrical contact assembly (fourth ECA) 100. The fourth ECA 100 has opposing surfaces 102 and 104 with electrical contacts 106 being exposed at the opposing surfaces 102, 104. Each electrical contact 106 exposed at one of the opposing surfaces 102, 104 of the fourth ECA 100 is electrically coupled to a corresponding electrical contact 106 exposed at the other opposing surface 102, 104. The fourth ECA 100 is formed in the same manner as previously described for the first ECA 30. The fourth ECA 100 is preferably positioned so that the electrical contacts 106 exposed at one of the opposing surfaces 102, 104 selectively mate to and mate from the electrical contacts 86 exposed at one of the opposing surfaces 82, 84 of the second ECA 80, as shown in FIGS. 10A, 10b and 10C. The electrical contacts 106 exposed at the other of the opposing surface 102, 104 of the fourth ECA 100 selectively mate to and mate from the electrical contacts on the circuit board 66 of the device under test.

FIGS. 11A-11F show various configurations of the resistive probing tip system 62 according to the present invention having the fourth ECA 100. In these configurations, the first carrier 10, the first ECA 30, the second ECA 80, third ECA 90 and the fourth ECA 100 may be secured to the probe head 64 of a logic analyzer probe or secured to the circuit board 66 of a device under test. Further configurations include the first ECA 30, second ECA 80, the third ECA 90 and the first carrier 10 secured to the probe head 64 of a logic analyzer probe with the fourth ECA 100 secured to the circuit board 66 of a device under test. In addition, the first ECA 30, third ECA 90 and the first carrier 10 may be secured to the probe head 64 of a logic analyzer probe with the second ECA 80 and the fourth ECA 100 secured to the circuit board 66 of a device under test. Also, the first ECA 30 and the third ECA 90 may be secured to the probe head 64 of the logic analyzer probe with the first carrier 10, the second ECA 80 and the fourth ECA 100 secured to the to the circuit board 66 of a device under test. Additionally, the third ECA 90 may be secured to the probe head 64 of the logic analyzer probe with the first carrier 10, the first ECA 30, the second ECA 80 and the fourth ECA 100 secured to the to the circuit board 66 of a device under test.

FIG. 11A shows the first carrier 10, the first ECA 30, the second ECA 80, the third ECA 90 and the fourth ECA 100 secured to the probe head 64 by the housing. The electrical contacts 96 exposed at one of the opposing surfaces 92, 94 of the third ECA 90 contact the electrical contacts on the circuit board in the probe head 64. The electrical contacts 106 exposed at one of the opposing surfaces 102, 104 of the fourth ECA 100 contact the electrical contacts on the circuit board 66 of the device under test when the probe head 64 is inserted into the socket housing 72 on the circuit board 66. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 106 exposed at the other of the opposing surfaces 102, 104 of the fourth ECA 100.

FIG. 11B shows the first carrier 10, the first ECA 30, the second ECA 80, the third ECA 90 and the fourth ECA 100 secured to the circuit board 66 of the device under test by the socket housing 72. The electrical contacts 96 exposed at one of the opposing surfaces 92, 94 of the third ECA 90 contact the electrical contacts on the circuit board in the probe head 64 when the probe head 64 is inserted into the socket housing 72 on the circuit board 66 of the device under test. The electrical contacts 106 exposed at one of the opposing surfaces 102, 104 of the fourth ECA 100 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 106 exposed at the other of the opposing surfaces 102, 104 of the fourth ECA 100.

FIG. 11C shows the first carrier 10, the first ECA 30, second ECA 80 and the third ECA 90 secured to the probe head 64 by the housing 70 and the second ECA 80 and the fourth ECA 100 secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 106 exposed at one of the opposing surfaces 102, 104 of the fourth ECA 100 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 106 exposed at the other of the opposing surfaces 102, 104 of the fourth ECA 100 when the probe head 64 is inserted into the socket housing 72 on the circuit board 66 of the device under test.

Figure 11D:
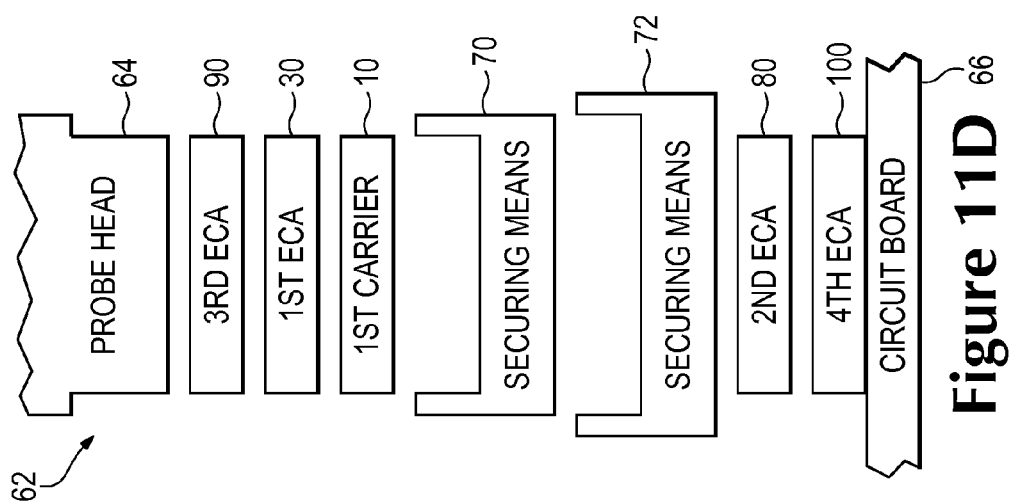

FIG. 11D shows the carrier 10, the first ECA 30 and the third EA 90 secured to the probe head 64 by the housing 70 and the second ECA 80 and the fourth ECA 100 secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 106 exposed at one of the opposing surfaces 102, 104 of the fourth ECA 100 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10. The electrical contacts 20 exposed at the other of the opposing surfaces 12, 14 of the first carrier 10 contact corresponding electrical contacts 86 exposed at one of the opposing surfaces 82, 84 of the second ECA 80 when the probe head 64 is inserted into the socket housing 72 on the circuit board 66 of the device under test. The electrical contacts 86 exposed at the other of the opposing surfaces 82, 84 of the second ECA 80 contact corresponding electrical contacts 106 exposed at the other of the opposing surfaces 102, 104 of the fourth ECA 100.

Figure 11E:
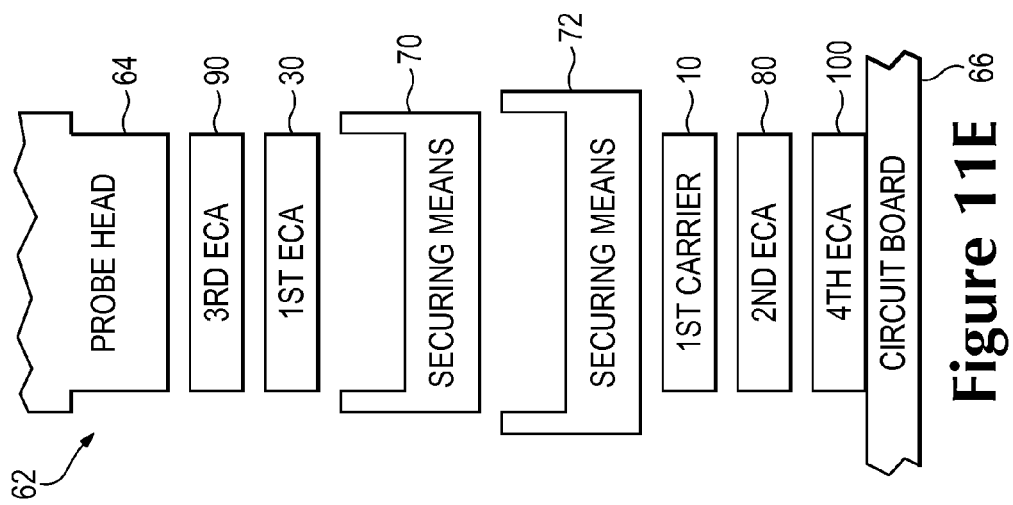

In FIG. 11E shows the first ECA 30 and the third ECA 90 secured to the probe head 64 by the housing and the first carrier 10, second ECA 80 and the fourth ECA 100 secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 106 exposed at one of the opposing surfaces 102, 104 of the fourth ECA 100 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90. The electrical contacts 36 exposed at the other of the opposing surfaces 32, 34 of the first ECA 30 contact corresponding electrical contacts 20 exposed at one of the opposing surfaces 12, 14 of the first carrier 10 when the probe head 64 is inserted into the socket housing 72 on the circuit board 66 of the device under test. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 106 exposed at the other of the opposing surfaces 102, 104 of the fourth ECA 100.

Figure 11F:
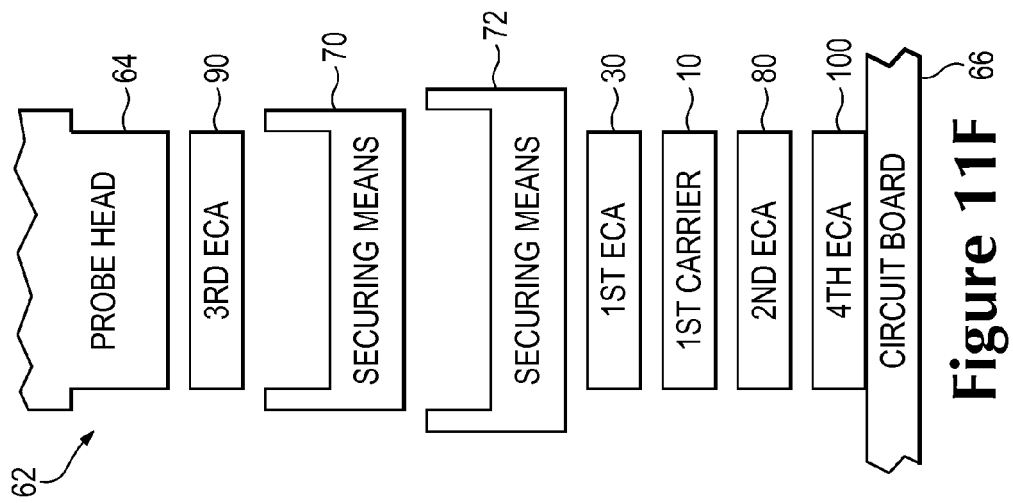

In FIG. 11F shows the third ECA 90 secured to the probe head 64 by the housing 70 and the first carrier 10, first ECA 30, second ECA 80 and the fourth ECA 100 secured to the circuit board 66 of the device under test by the socket housing 72. The electrical contacts 96 exposed at one of the opposing surfaces 92, 94 of the third ECA 90 contact the electrical contacts on the circuit board in the probe head 64. The electrical contacts 106 exposed at one of the opposing surfaces 102, 104 of the fourth ECA 100 contact the electrical contacts on the circuit board 66 of the device under test. The electrical contacts 36 exposed at one of the opposing surfaces 32, 34 of the first ECA 30 contact corresponding electrical contacts 96 exposed at the other of the opposing surfaces 92, 94 of the third ECA 90 when the probe head 64 is inserted into the socket housing 72 on the circuit board 66 of the device under test. The electrical contacts 36 exposed at the other of the opposing surfaces 32, 34 of the first ECA 30 contact corresponding electrical contacts 20 exposed at one of the opposing surfaces 12, 14 of the first carrier. The electrical contacts 20 exposed at the other of the opposing surfaces 12, 14 of the first carrier 10 contact corresponding electrical contacts 86 exposed at one of the opposing surfaces 82, 84 of the second ECA 80. The electrical contacts 86 exposed at the other of the opposing surfaces 82, 84 of the second ECA 80 contact corresponding electrical contacts 106 exposed at the other of the opposing surfaces 102, 104 of the fourth ECA 100.

The various configurations of the resistive probing tip system 62 according to the present invention are shown and described in FIGS. 3A and 3B, FIGS. 5A through 5G, FIGS. 6A through 6C, FIGS. 7A through 7L, FIGS. 8A through 8C, FIGS. 9A through 9J, FIGS. 10A through 10C and 11A through 11F using a first carrier 10. The configurations of FIGS. 6A through 6C, FIGS. 7A through 7L, FIGS. 8A through 8C, FIGS. 9A through 9J, FIGS. 10A through 10C and 11A through 11F may also be implemented using the first and second carriers 50, 52 as shown and described in relation to FIG. 4 and FIGS. 5G through 5L without departing from the scope of the appended claims. Further, the present invention has been described with specific reference to numbered electrical contact assemblies (i.e. first ECA 30, second ECA 80, third ECA 90, fourth ECA 100) positioned at particular locations in the resistive probing tip system 62. It is understood that any one of the numbered electrical contact assemblies may be substituted in a position for any other of the numbered electrical contact assemblies without departing from the scope of the appended claims. In addition, there are no unterminated stubs on the electrical contacts of the circuit board 66 of the device under test that can affect the circuits of the device under test when the carrier or carriers 10, 50, 52 and the electrical contact assemblies 30, 80, 90, 100 of the various resistive probing tip systems 62 are secured in the probe head 64.

Figure 12:
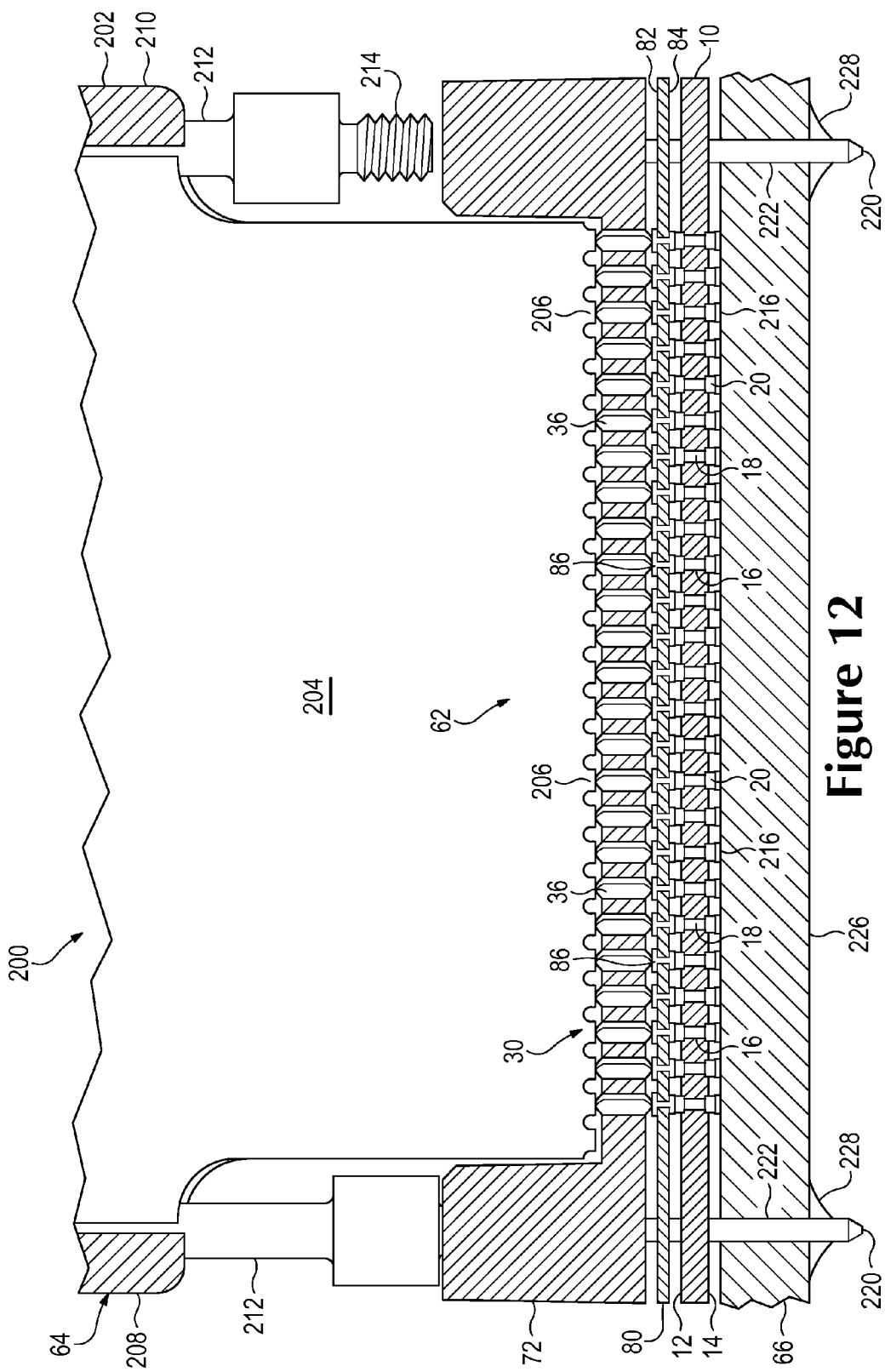
FIG. 12 is a first example of a logic analyzer probing system using the resistive probing tip system of the present invention.
Figure 13:
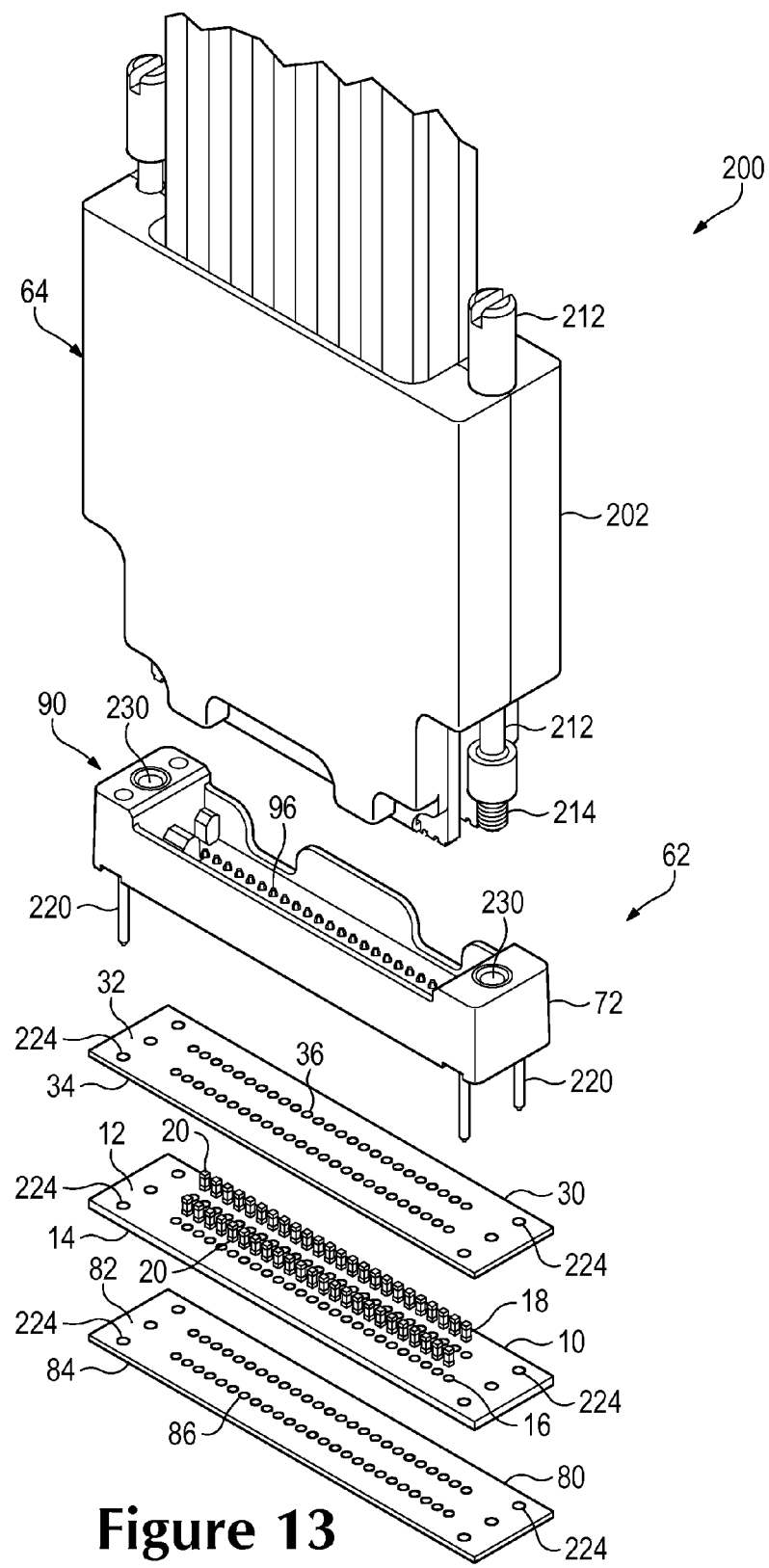
FIG. 13 is a second example of a logic analyzer probing system using the resistive probing tip system of the present invention.

FIG. 12 illustrates a sectional view of a first example of a logic analyzer probing system 200 using the resistive probing tip system 62 of the present invention. The logic analyzer probe head 64 has a substantially rectangular shaped body 202 having at least a first circuit board 204 with downward facing electrical contacts 206 formed on an edge surface thereof. Bores are formed within the body 202 adjacent to the side surfaces 208, 210 thereof that receive respective screws 212. The screws 212 have threaded end portions 214 the engage corresponding threaded bores (as shown in FIG. 13) formed in the socket housing 72. The logic analyzer probe head 64 is positioned in the socket housing 72 with the screws 212 in the probe head 64 engaging the threaded bores in the socket housing 72. The tightening of the screws 212 in the threaded bores of the socket housing 72 secures the probe head 64 to the socket housing 72.

The carrier 10 is shown with apertures 16 receiving the discrete resistors 18. The electrical contacts 20 on one end of each of the discrete resistors 18 exposed at the bottom surface 14 of the carrier 10 are positioned directly on one of the electrical contacts 216 on the circuit board 66 of the device under test. The electrical contacts 20 on the other end of the discrete resistors 18 exposed at the upper surface 12 of the carrier 10 mate with the electrical contacts 86 exposed at the bottom surface 84 of the second ECA 80. The electrical contacts 86 exposed at the top surface 82 of the second ECA 80 mate with the electrical contacts 36 exposed at the bottom surface 34 of the first ECA 30. The electrical contacts 36 exposed at the top surface 32 of the first ECA 30 mate with the electrical contacts 206 on the circuit board 204 of the probe head 64 when the probe head 64 is secured to the socket housing 72. In this example, the first ECA 30 is integrated in the socket housing 72 that secures the carrier 10 and second ECA 80 to the circuit board 66 of the device under test. The electrical contacts 36 of the first ECA 30 may be traditional C-shaped electrical contacts having a length of 0.10 inches. Since the stub length is minimized by the electrical contacts 20 of the discrete resistors 18 being in contact with the electrical contacts on the circuit board 66 of the device under test, the electrical contacts 36 can be optimized for their mechanical characteristics instead of being limited by stub length concerns.

The socket housing 72 has downward extending metal pins 220 that are received in corresponding apertures 222 formed in the circuit board 66 of the device under test. The carrier 10 and the second ECA 80 have apertures 224 formed therein (as shown in FIG. 13) that match the locations of the metal pins 220. The apertures 224 formed in the carrier 10 and the second ECA 80 are aligned with the metal pins 220 of the socket housing 72 and the apertures 222 formed in the circuit board 66 so that the carrier 10 and the second ECA 80 are captured between the socket housing 72 and the circuit board 66 when the socket housing 72 is positioned on the circuit board 66. The metal pins 220 of the socket housing 72 extend past the bottom surface 226 of the circuit board 66 of the device under test where solder or other types of affixing material 228 are used to secure the socket housing 72 to the circuit board 66 of the device under test.

FIG. 13 is an exploded perspective view showing a second example of a logic analyzer probing system 200 using the resistive probing tip system 62 of the present invention. The threaded portions 214 of screws 212 in the probe body 202 of the logic analyzer probe head 64 engage corresponding threaded bores 230 formed in the socket housing 72 for securing the probe head 64 to the socket housing 72. The socket housing 72 has metal pins 220 that are used to align the resistive probing tip system 62 in the logic analyzer probing system 200. The resistive probing tip system 62 in this example has a carrier 10 with apertures 16 formed therein that receive the discrete resistors 18. The electrical contacts 20 exposed the opposing ends of each of the discrete resistors 18 extend past the opposing surfaces 12, 14 of the carrier 10. The electrical contacts 20 on one end of the discrete resistors 18 contact the electrical contacts 36 exposed at the bottom surface 34 of the first ECA 30. The electrical contacts 20 on the other end of the discrete resistors 18 contact the electrical contacts 86 exposed at the top surface 82 of the second ECA 80. The electrical contacts 86 exposed at the bottom surface 84 of the second ECA 80 contact the electrical contacts on the circuit board 66 of the device under test. The socket housing 72 may include a third ECA 90 having electrical contacts 96, such as C-shaped electrical contacts or the like, that contact the electrical contacts 36 exposed at the top surface 32 of the first ECA 30. The electrical contacts 96 in the socket housing 72 contact the electrical contacts 206 exposed at the bottom edge of the circuit board 204 in the logic analyzer probe head 64.

Figure 14:
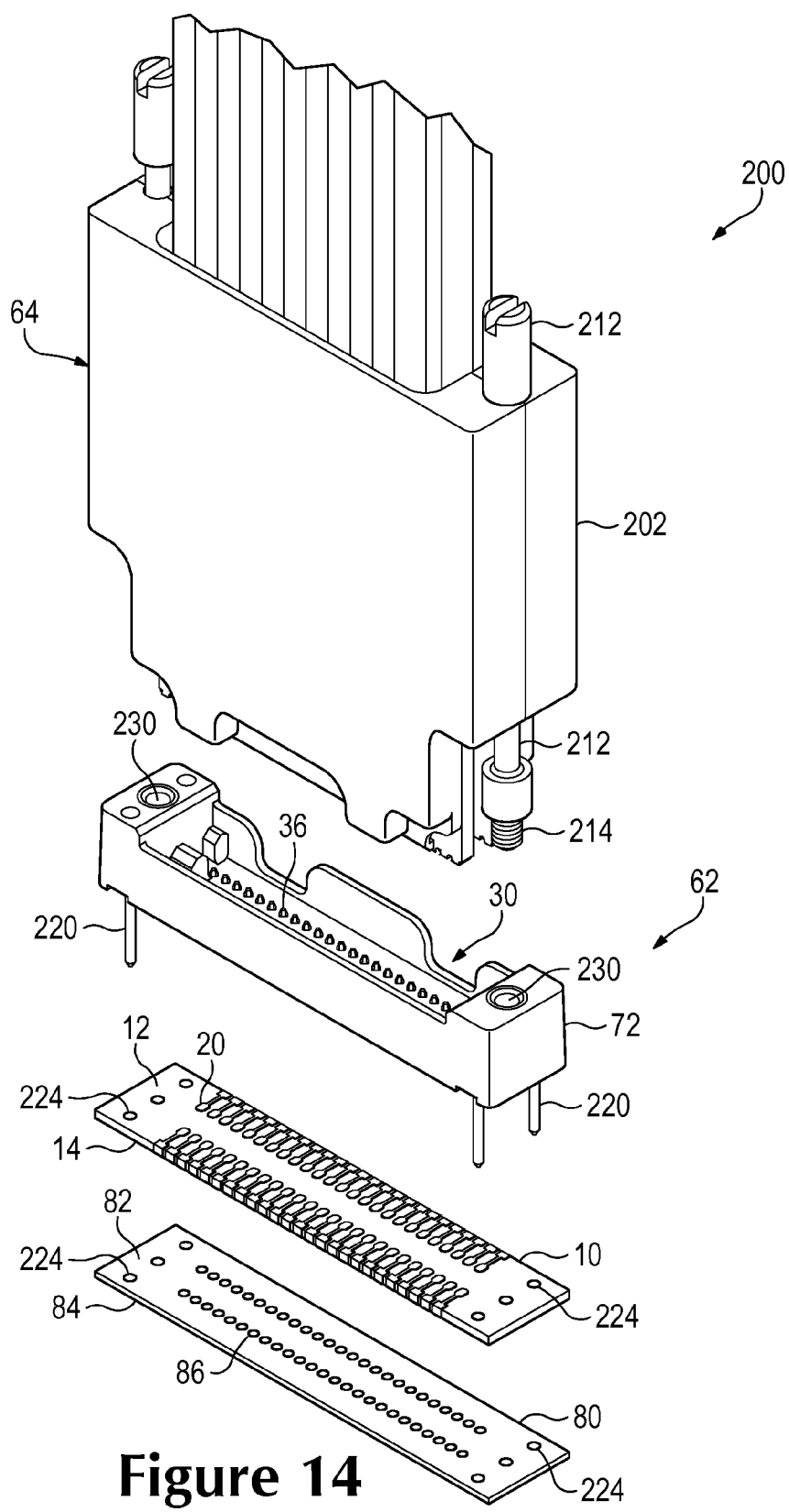
FIG. 14 is a third example of a logic analyzer probing system using the resistive probing tip system of the present invention.

FIG. 14 is an exploded perspective view showing third example of a logic analyzer probing system 200 using the resistive probing tip system 62 of the present invention. The first ECA 30 is disposed in the socket housing 72. The upward facing electrical contacts 36 shown in the socket housing 72 contact the electrical contacts 206 exposed at the bottom edge of the circuit board 204 in the logic analyzer probe head 64 when the probe head 64 is inserted into the socket housing 72. The bottom facing electrical contacts 36 in the socket housing 72 contact the electrical contacts 20 exposed at the upper surface 12 of the carrier 10. The electrical contacts 20 exposed at the bottom surface 14 of the carrier 10 contact the electrical contacts 86 exposed at the upper surface 82 of the second ECA 80. The electrical contacts 86 exposed at the bottom surface 84 of the second ECA 80 contact the electrical contacts exposed on the circuit board 66 of the device under test.

It is understood that the electrical contact assemblies described in FIGS. 12, 13 and 14 may take the form of the previously shown electrical contact assemblies in FIGS. 3A and 3B and described above. Further, it is understood that other carrier designs may be substituted for the carriers 10 shown and described in FIGS. 12, 13 and 14.

Figure 15:
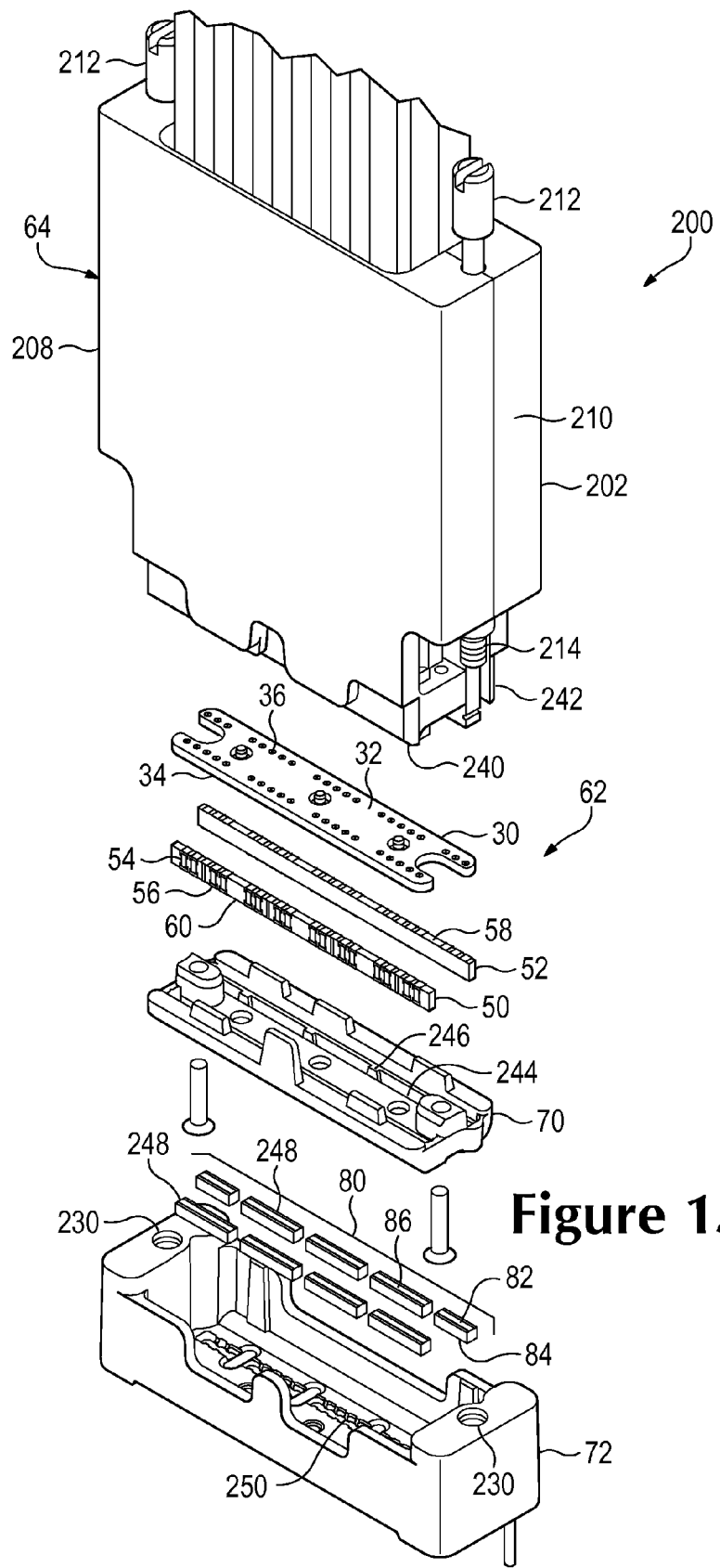
FIG. 15 is a fourth example of a logic analyzer probing system using the resistive probing tip system of the present invention.

FIG. 15 is an exploded perspective view showing a fourth example of a logic analyzer probing system 200 using the resistive probing tip system 62 of the present invention. In this example, there are first and second carriers 50 and 52, such as described with respect to FIG. 4, that mate with first and second circuit boards 240 and 242 disposed in the body 202 probe head 64. Bores are formed within the body 202 adjacent to the side surfaces 208, 210 thereof that receive respective screws 212. The screws 212 have threaded end portions 214 the engage corresponding threaded bores 230 formed in the socket housing 72. The logic analyzer probe head 64 is positioned in the socket housing 72 with the screws 208 in the probe head 64 engaging the threaded bores in the socket housing 72. The tightening of the screws 208 in the threaded bores of the socket housing 72 secures the probe head 64 to the socket housing 72.

A first ECA 30, such as described with respect to FIG. 3B, has electrical contacts 36 exposed at the top surface 32 that contact downward facing electrical contacts 206 formed on the edge surfaces of the circuit boards 240, 242. The electrical contacts 36 exposed at the bottom surface 34 of the first ECA contact the respective electrical contacts 56 exposed at the top edge surfaces 58 of the first and second carriers 50 and 52. The first ECA 30 and the first and second carriers 50, 52 are secured to the probe head 64 by housing 70. The housing 70 has lateral slots 244 formed therein with inward extending shouldered ribs 246 which support the first and second carriers 50, 52 in the lateral slots 244. The electrical contacts 56 exposed at the bottom edge surfaces 58 of the first and second carriers 50, 52 are exposed in the lateral slots 244.

A second ECA 80 is formed from elastomeric material having multiple elements 248. Each of the elastomeric elements 248 has electrical contacts 86 formed through the elastomeric material. The electrical contacts 86 may be formed from multiple fine electrical wires with the fine electrical wires extending to the opposing surfaces 82, 84 of the multiple elastomeric elements 248 in the second ECA 80. The multiple elastomeric elements 248 of the second ECA 80 are positioned in slots 250 formed in the socket housing 72. The socket housing 72 is secured to the circuit board 66 of the device under test using the metal pins 220 such that the electrical contacts 86 exposed at the bottom surface 84 of the multiple elastomeric elements 248 contact the electrical contacts on the circuit board 66 of the device under test. The electrical contacts 86 exposed at the top surface 82 of the multiple elastomeric elements 248 contact corresponding electrical contacts 56 exposed at the bottom edge surfaces of the first and second carriers 50, 52 when the probe head 64 is inserted into the socket housing 72.

Figure 16:
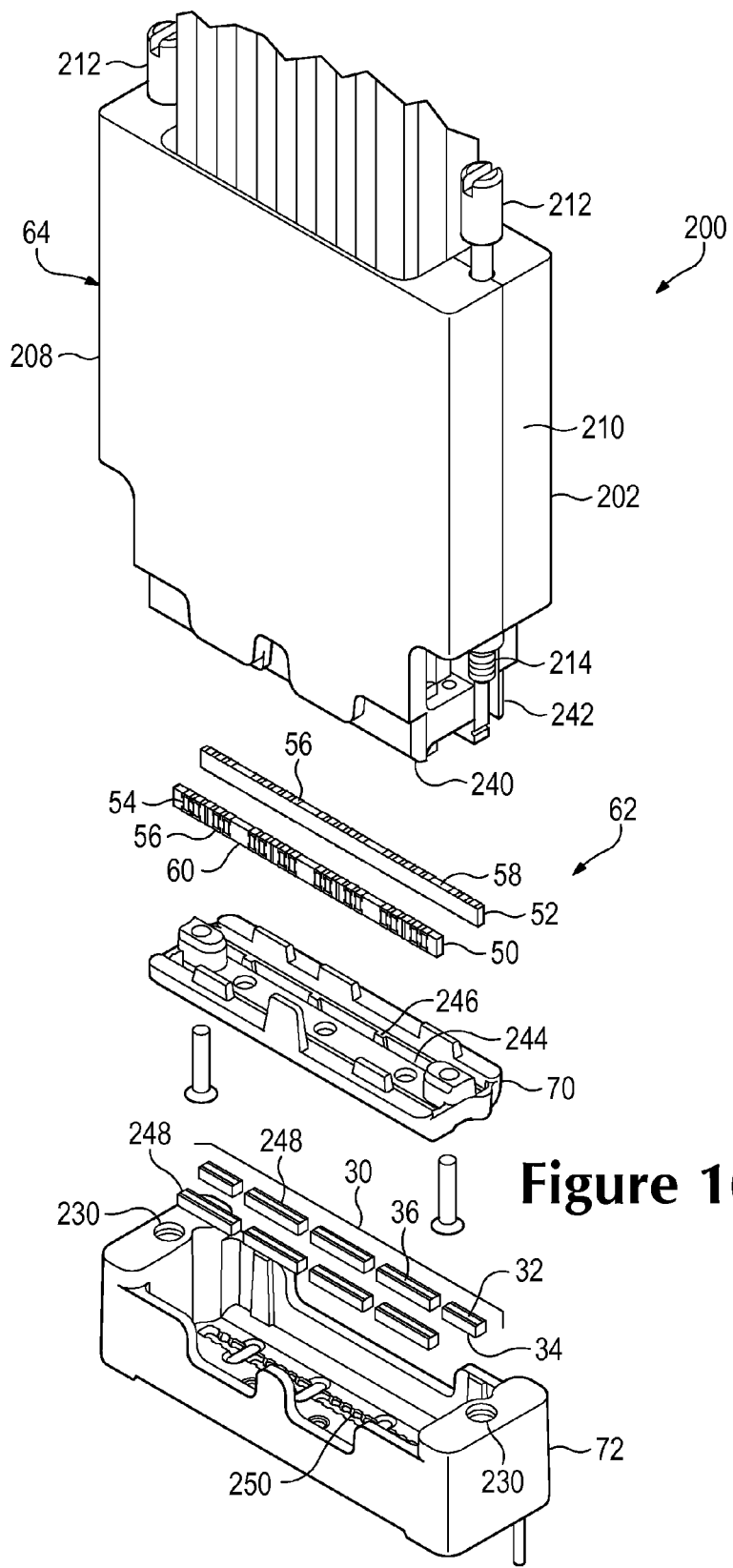
FIG. 16 is another example of a logic analyzer probing system using the resistive probing tip system of the present invention.

FIG. 16 is an exploded perspective view showing another example of a logic analyzer probing system 200 using the resistive probing tip system 62 of the present invention. In this example, the electrical contact assembly between the circuit boards 240, 242 in the probe head 64 and the first and second carriers 50 and 52, as shown in FIG. 15, is removed. The electrical contacts 56 exposed at the upper edge surfaces 58 of the first and second carriers 50, 52 respectively contact corresponding electrical contacts exposed at the bottom edges of the first and second circuit boards 240, 242. The electrical contacts 56 exposed at the bottom edge surfaces of the first and second carriers 50, 52 contact the electrical contacts 36 exposed at the top surfaces 32 of the multiple elastomeric elements 248 of the first ECA 30 when the probe head is inserted in the socket housing 72. The electrical contacts 36 exposed at the bottom surface 34 of the multiple elastomeric elements 248 contact the electrical contacts on the circuit board 66 of the device under test.

Some of the configurations of the resistive probing tip system 62 have two electrical contact assemblies between the electrical contacts on the circuit board 66 of the device under test and the carrier or carriers 10, 50, 52. As previously described, the electrical contact assemblies have various heights depending on the materials used. An electrical contact assembly made of flex circuit material has a nominal height of 0.010 inches. An electrical contact assembly made of elastomeric material has a nominal free height of 0.039 inches and a nominal compressed height of 0.031 inches. An electrical contact assembly having metal spring electrical contacts disposed in a housing has a nominal free height of 0.036 inches and a nominal compressed height of 0.031 inches. Two electrical contact assemblies made of flex circuit material have a nominal height of 0.020 inches. A combination of a first electrical contact assembly made with flex circuit material and a second electrical contact assembly made elastomeric material or made with metal spring electrical contacts in a housing have a nominal compressed height of 0.041 inches. Two electrical contact assemblies made from either of the elastomeric material or metal spring electrical contacts disposed in a housing have a nominal compressed height of 0.062 inches. Each of these combinations results in an unterminated stub length between the electrical contacts on the circuit board 66 of the device under test and the resistive elements 18, 22, 54 on the carrier or carriers 10, 50, 52 that is substantially less than the unterminated stub lengths in the prior art.

A logic analyzer probing system 200 of FIG. 15 constructed with resistive probing tip system 62 has successfully probed device under test circuitry operating at 8 Gb/s. In contrast, prior art logic analyzer probing systems are unable to probe device under test circuitry operating faster than 5 Gb/s. Additional increases in the speed of device under test circuitry that can be successfully probed by a logic analyzer probing system 200 constructed with the resistive probing tip system 62 are likely if the size of the discrete resistive elements 18 are reduced. The current resistive elements 18 of carrier 10 are comparable in size to 0402 discrete resistors. This finding indicates that a logic analyzer probing system 200 constructed with 0402 discrete resistor elements 18 can also successfully probe DUT circuits operating at 8 Gb/s. Furthermore, the logic analyzer probing system constructed with resistive elements made with 0201 discrete resistors should be able to successfully probe DUT circuits operating significantly faster than 8 Gb/s.

While current embodiments of the resistive probing tip system usable in a logic analyzer probing system have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The use of the conjunction "or" in the following claims is to be understood in the inclusive sense (i.e., one, or the other, or both alternatives). Moreover, it should be noted that while both alternatives may be present simultaneously, such simultaneous presence is not required.

What is claimed is:

1. A resistive probing tip system comprising:
   at least a first carrier having opposing surfaces, said first carrier retaining a plurality of resistors with each resistor having opposing electrical contacts exposed at respective opposing surfaces of the first carrier;
   at least a first electrical contact assembly having opposing surfaces with electrical contacts exposed at the respective opposing surfaces with each electrical contact exposed at one opposing surface electrically coupled to a corresponding electrical contact exposed at the other opposing surface;
   the first carrier and the first electrical contact assembly selectively mating to and mating from each other with the electrical contacts exposed at one surface of the first carrier and the electrical contact exposed at one surface of the first electrical contact assembly contacting each other; and
   means for selectively securing at least one of the first carrier or the first electrical contact assembly to at least one of a circuit board or a probe head.

2. The resistive probing tip system as recited in claim 1 further comprising:
   multiple carriers having opposing surfaces, each of said multiple carriers retaining a plurality of resistors with each resistor having opposing electrical contacts exposed at respective opposing surfaces of the resistor's carrier;
   the first carrier and one or more of the multiple carriers selectively mating to and mating from the first electrical contact assembly with the electrical contacts exposed at one surface of the first carrier and one or more of the multiple carriers contacting corresponding electrical contacts exposed at one surface of the first electrical contact assembly; and
   means for selectively securing at least one of the first carrier and one or more of the multiple carriers or the first electrical contact assembly to at least one of the circuit board or the probe head.

3. The resistive probing tip system as recited in claim 2 wherein the plurality of resistors retained by the first carrier and multiple carriers are discrete resistors disposed in apertures formed through the respective first carrier and multiple carriers.

4. The resistive probing tip system as recited in claim 2 wherein each of the first carrier and one or more of the multiple carriers comprises a ceramic substrate with the plurality of resistors disposed on each of the ceramic substrates.

5. The resistive probing tip system as recited in claim 1 wherein the first electrical contact assembly is formed from at least one of a flex circuit, a housing having compressible spring contacts disposed therein, or an elastomeric material having electrically conductive elastomeric contact.

6. A resistive probing tip system comprising:
   at least a first carrier having opposing surfaces, said first carrier retaining a plurality of resistors with each resistor having opposing electrical contacts exposed at respective opposing surfaces of the first carrier;
   a first electrical contact assembly having opposing surfaces with electrical contacts exposed at the respective opposing surfaces with each electrical contact exposed at one opposing surface electrically coupled to a corresponding electrical contact exposed at the other opposing surface;
   a second electrical contact assembly having opposing surfaces with electrical contacts exposed at the respective opposing surfaces with each electrical contact exposed at one opposing surface electrically coupled to a corresponding electrical contact exposed at the other opposing surface;
   the first carrier, the first electrical contact assembly and the second electrical contact assembly selectively mating to and mating from one another with the electrical contacts exposed at the opposing surfaces of the first carrier, first electrical contact assembly and the second electrical contact assembly selectively contacting corresponding electrical contacts exposed at the mating opposing surfaces of the first carrier, first electrical contact assembly and the second electrical contact assembly; and
   means for selectively securing at least one of the first carrier, the first electrical contact assembly or the second electrical contact assembly to at least one of a circuit board or a probe head.

7. The resistive probing tip system as recited in claim 6 wherein the first carrier is disposed between the first and second electrical contact assemblies and a third electrical contact assembly selectively mates to and mates from at least one of the first electrical contact assemblies and the second electrical contact assemblies.

8. The resistive probing tip system as recited in claim 6 wherein the first carrier is disposed between the first and second electrical contact assemblies and a third electrical contact assembly mates to and mates from one of the first electrical contact assemblies and the second electrical contact assemblies and a fourth electrical contact assembly mates to and mates from the other of the first electrical contact assemblies and the second electrical contact assemblies.

9. The resistive probing tip system as recited in claim 6 further comprising:
   at least a second carrier having opposing surfaces, said second carrier retaining a plurality of resistors with each resistor having opposing electrical contacts exposed at respective opposing surfaces of the second carrier;
   the first carrier and the second carrier selectively mating to and mating from at least one of the first electrical contact assembly and the second electrical contact assembly with the electrical contacts exposed at the opposing surfaces of the first and second carriers, first electrical contact assembly and the second electrical contact assembly selectively contacting corresponding electrical contacts exposed at the mating opposing surfaces of the first and second carriers, first electrical contact assembly and the second electrical contact assembly; and
   means for selectively securing at least one of the first and second carriers, the first electrical contact assembly or the second electrical contact assembly to at least one of the circuit board or the probe head.

10. The resistive probing tip system as recited in claim 9 wherein the first and second carriers are disposed between the first and second electrical contact assemblies and a third electrical contact assembly selectively mates to and mates from at least one of the first electrical contact assemblies and the second electrical contact assemblies.

11. The resistive probing tip system as recited in claim 9 wherein the first and second carriers are disposed between the first and second electrical contact assemblies and a third electrical contact assembly mates to and mates from one of the first electrical contact assemblies and the second electrical contact assemblies and a fourth electrical contact assembly mates to and mates from the other of the first electrical contact assemblies and the second electrical contact assemblies.

12. The resistive probing tip system as recited in claim 11 wherein the first electrical contact assembly, the second electrical contact assembly, the third electrical contact assembly and the fourth electrical contact assembly are formed from at least one of a flex circuit, a housing having compressible spring contacts disposed therein, or an elastomeric material having electrically conductive elastomeric contact.

13. The resistive probing tip system as recited in claim 9 wherein the plurality of resistors retained by the first and second carriers are discrete resistors disposed in apertures formed through the first and second carriers.

14. The resistive probing tip system as recited in claim 9 wherein each of the first and second carriers comprises a ceramic substrate with the plurality of resistors being disposed on the first and second ceramic substrates.

15. A logic analyzer probing system comprising:
a probe head containing at least a first circuit board having electrical contacts thereon;
at least a first electrical contact assembly having opposing surfaces with electrical contacts exposed at the respective opposing surfaces with each electrical contact exposed at one opposing surface electrically coupled to a corresponding electrical contact exposed at the other opposing surface;
at least a first carrier having opposing surfaces, said first carrier retaining a plurality of resistors with each resistor having opposing electrical contacts exposed at respective opposing surfaces of the first carrier;
the first circuit board of the probe head, the first electrical contact assembly and the first carrier selectively mating to and mating from one another with the electrical contacts exposed at the surfaces of the first circuit board of the probe head, the first electrical contact assembly and the first carrier contacting corresponding electrical contacts exposed at the mating surfaces of the first circuit board of the probe head, the first electrical contact assembly and the first carrier; and
a housing secured to the probe head receiving at least one of the first carrier and first electrical contact assembly for capturing at least one of the first electrical contact assembly and the first carrier between the first circuit board of the probe head and the housing.

16. The logic analyzer probing system as recited in claim 15 further comprising:
a second circuit board having electrical contacts thereon contained in the probe head;
at least a second carrier having opposing surfaces, said second carrier retaining a plurality of resistors with each resistor having opposing electrical contacts exposed at respective opposing surfaces of the second carrier;
the second circuit board of the probe head, the first electrical contact assembly and the second carrier selectively mating to and mating from one another with the electrical contacts exposed surfaces of the second circuit board of the probe head, the first electrical contact assembly and the second carrier contacting corresponding electrical contacts exposed at the mating surfaces of the second circuit board of the probe head, the first electrical contact assembly and the second carrier; and
the housing receiving the first electrical contact assembly or the first and second carriers for capturing the first electrical contact assembly and the first and second carriers or the first electrical contact assembly or the first and second carriers between the first and second circuit boards of the probe head and the housing.

17. The logic analyzer probing system as recited in claim 16 further comprising:
at least a second electrical contact assembly having opposing surfaces with electrical contacts exposed at the respective opposing surfaces, each electrical contact exposed at one opposing surface electrically coupled to a corresponding electrical contact exposed at the other opposing surface;
the second electrical contact assembly selectively mating to and mating from the first and second carriers or the first electrical contact assembly with the electrical contacts exposed at the surfaces of the second electrical contact assembly contacting corresponding electrical contacts exposed at the mating surfaces of the first and second carriers or the first electrical contact assembly; and
the housing receiving the second electrical contact assembly or the first and second carriers for capturing the first and second carriers, the first electrical contact assembly and the second electrical contact assembly or the first electrical contact assembly and the second electrical contact assembly between the first and second circuit boards of the probe head and the housing.

18. The logic analyzer probing system as recited in claim 16 further comprising a second electrical contact assembly having opposing surfaces with electrical contacts exposed at the respective opposing surfaces, each electrical contact exposed at one opposing surface electrically coupled to a corresponding electrical contact exposed at the other opposing surface, the second electrical contact assembly being secured to a circuit board of a device under test having a plurality of electrical contacts with the electrical contacts exposed at one surface of the second electrical contact assembly selectively mating to and mating from the electrical contacts of the circuit board of the device under test and the electrical contacts exposed at the other surface of the second electrical contact assembly selectively mating to and mated from the electrical contacts of the first and second carriers.

19. The logic analyzer probing system as recited in claim 15 further comprising:
at least a second electrical contact assembly having opposing surfaces with electrical contacts exposed at the respective opposing surfaces with each electrical contact exposed at one opposing surface electrically coupled to a corresponding electrical contact exposed at the other opposing surface;
the first electrical contact assembly, second electrical contact assembly and the first carrier selectively mating to and mating from one another with the electrical contacts exposed at the opposing surfaces of the first electrical contact assembly, the second electrical contact assembly and the first carrier contacting corresponding electrical contacts exposed at the mating surfaces of the first electrical contact assembly, the second electrical contact assembly and the first carrier; and
the housing receiving the second electrical contact assembly or the first carrier for capturing the first carrier, the first electrical contact assembly and the second electrical contact assembly or the first electrical contact assembly and the second electrical contact assembly between the first circuit board of the probe head and the housing.

20. The logic analyzer probing system as recited in claim 15 further comprising a second electrical contact assembly having opposing surfaces with electrical contacts exposed at the respective opposing surfaces, each electrical contact exposed at one opposing surface electrically coupled to a corresponding electrical contact exposed at the other opposing surface, the second electrical contact assembly being secured to a circuit board of a device under test having a plurality of electrical contacts with the electrical contacts exposed at one surface of the second electrical contact assembly selectively mating to and mating from the electrical contacts of the circuit board of the device under test and the electrical contacts exposed at the other surface of the second electrical contact assembly selectively mating to and mating from the electrical contacts of the first carrier.

\* \* \* \* \*